United States Patent [19]
Hibino et al.

[11] Patent Number: 5,977,478
[45] Date of Patent: Nov. 2, 1999

[54] SOLAR MODULE

[75] Inventors: Kouetsu Hibino, Nissin; Hiroshi Hasegawa, Shizuoka, both of Japan

[73] Assignee: Toyota Jidosha Kabushiki Kaisha, Japan

[21] Appl. No.: 08/985,260

[22] Filed: Dec. 4, 1997

[30] Foreign Application Priority Data

Dec. 5, 1996 [JP] Japan ................................ 8-324908
Jul. 2, 1997 [JP] Japan ................................ 9-177432

[51] Int. Cl.⁶ ...................................................... H01L 31/04
[52] U.S. Cl. ......................... 136/259; 136/246; 126/684; 126/685; 126/698; 250/216; 250/225; 257/432; 257/436; 359/831; 359/834; 359/837; 359/742; 359/485; 359/494; 359/496; 359/497
[58] Field of Search ....................................... 136/246, 259; 126/684, 685, 698; 250/216, 225; 257/432, 436; 359/831, 834, 837, 742, 485, 494, 496, 497

[56] References Cited

U.S. PATENT DOCUMENTS 4,074,704  2/1978  Gellert .................................... 136/246
4,863,224  9/1989  Afian et al. ............................ 136/246

FOREIGN PATENT DOCUMENTS 54-18762   2/1979   Japan .
62-266879  11/1987  Japan .
2-203160   8/1990   Japan .
6-275859   9/1994   Japan .
6-511602   12/1994  Japan .
WO 91/04580  4/1991  WIPO .

OTHER PUBLICATIONS

Mills et al., Solar Energy, vol. 21, pp. 423–430 (month unknown), 1978.

*Primary Examiner*—Alan Diamond
*Attorney, Agent, or Firm*—Finnegan, Henderson, Farabow, Garrett, & Dunner, LLP

[57] ABSTRACT

For the purpose of providing a solar module which has a fixed type solar concentrator of high converging magnification, a solar cell 12 is installed on the bottom face of an extension 30 which is extended further from the apex of a V shape formed by a pair of prisms having a refractive index larger than that of air, and a mirror surface 18 is formed on the back side of an incident surface 20 on which sunlight 10 falls. The mirror surface 18 and the incident surface 20 are formed in such a manner that their distance widens toward the apex of the V shape. The sunlight 10 incident on the prisms 16 performs reflection on the mirror surface 18 and total internal reflection on the incident surface 20, respectively. After repeating such reflection, the sunlight 10 reaches the bottom of the extension 30, where it emerges as outgoing light 22 to the solar cell 12.

14 Claims, 27 Drawing Sheets

5,977,478

SOLAR MODULE

BACKGROUND OF THE INVENTION

1. Field of the Invention

The present invention relates to a solar module having a solar concentrator and especially to a solar concentrator having an improved converging.

2. Description of the Related Art

Heretofore, it has been well known that there is technique to reduce an area to be used for expensive solar cell by converging sunlight through a lens for the purpose of reducing the costs of a power generation system which uses solar batteries. Also, a technique to track the sun for the purpose of improving the generation efficiency of a solar module is well known. However, such a tracking system leads to high driving costs of the solar module and requires a lot of man-hours for maintenance. Therefore, fixed type solar concentrators have been conceived.

Japanese Patent Laid-Open Publication No. Hei 2-203160 discloses such a fixed type solar concentrator. This conventional fixed type solar concentrator has a so called tapering constitution as shown in FIG. 16. More specifically, an internal mirror is constructed in such a manner that the diameter of the mirror on the solar cell side is shorter than the diameter on the other side.

However, in the conventional solar concentrator described above, a part of the sunlight 10 incident on the taperingly constructed internal mirror 100 performs repetitive reflection on the internal mirror 100 and finally goes out in the direction of incidence, namely, the direction back toward the sky. Therefore, there is a problem that in a solar concentrator using the taperingly constructed internal mirror 100, the converging magnification cannot be improved.

FIG. 17 exemplifies a device which converges the sunlight 10 on the reception surface of a solar cell 12 by using the taperingly constructed internal mirror 100 as shown in FIG. 16. In FIG. 17, it is defined that an incident angle is an angle θ between a direction of the sunlight 10 and a normal line 14 which is made perpendicular to the reception surface of the solar cell 12.

FIG. 18 shows a relation between the incident angle mentioned above and outgoing intensity as the proportion of partial sunlight incident on the reception surface of the solar cell 12 to all the sunlight incident on the solar concentrator in the solar module shown in FIG. 17. The axis of ordinates shows the outgoing intensity and the axis of abscissas shows the incident angle, respectively. The solar concentrator shown in FIG. 17 is 60 mm in height. The diameter of an incident port is 40 mm and the diameter of an outgoing port is 8 mm. The converging ratio of the solar concentrator is 2.5 to 1.

As shown in FIG. 18, with the increase of incident angle, outgoing intensity falls, and when the incident angle exceeds an angle of 10 degrees, the outgoing intensity drops to 25 percent or less. As described above, this is because with the increase of the incident angle, an amount of sunlight which goes out in the direction of the incidence increases due to the reflection on the taperingly constructed internal mirror 100.

As described above, the converging magnification cannot be improved in such a tapering type solar concentrator due to the existence of the sunlight which goes out in the direction of the incidence. On the other hand, in a solar concentrator in which a section of the internal mirror 102 is arranged with parallel sides as shown in FIG. 19 or a solar concentrator in which a section of the internal mirror 102 is arranged in such a manner that the diameter of the mirror widens toward the solar cell as shown in FIG. 20, the incident sunlight will not go out in the direction of the incidence during the repetition of reflection. However, since an incident port and an outgoing port are of the same size or the former is smaller than the latter, it is impossible to improve the converging magnification.

Also, Japanese Patent Laid-open Publication No. Sho 54-18762 discloses a solar concentrator composed of a prism which has a triangular section and performs convergence by utilizing reflection and total internal reflection. In FIG. 21, constitution of the prism 16 disclosed in the aforementioned reference is exemplified. Also, in an example of FIG. 22, a pair of prisms 16 the mate of which is shown in FIG. 21 are arranged facing each other in a V shape. In the examples of constitution shown in FIGS. 21 and 22, a surface arranged opposite to an incident surface 20 is a mirror surface 18. The sunlight 10 which comes in through the incident surface 20 is reflected on the mirror surface 18. The sunlight 10 then returns to the incident surface 20 again. It performs total internal reflection there and enters the solar cell 12.

However, in the constitution shown in FIG. 21, in order to satisfy the conditions of total internal reflection on the incident surface 20, an apex angle α of the prism 16 has to be larger than a prescribed angle. Therefore, there has been such a problem that a ratio of the surface area of the solar cell 12 to the surface area of the incident surface 20 is automatically determined, thereby making it impossible to obtain a converging magnification which exceeds a prescribed value.

Also in the constitution shown in FIG. 22, for the purpose of arranging two prisms 16 face to face, the corresponding solar cells 12 are arranged on the bottom face of the prism 16 not in a straight line, but in such a way that they define a prescribed angle with respect to each other. Consequently, in the solar concentrator according to this embodiment, mounting in an actual device is practically difficult.

The constitution as shown in FIG. 23 can also serve the purpose of arranging two prisms 16 face to face. More specifically, in order to have a flat bottom face on the apex side of a V-shaped substance, there is provided an extension 30 which is extended further from the apex of the V-shaped substance. Due to such a constitution, the solar cells 12 can be arranged in a straight line. In this case, however, as the extension 30 is in a tapering form as shown in FIG. 16, total internal reflection may be repeatedly performed at that part and the sunlight 10 may go out in the direction of incidence. Therefore, in order to form the extension 30 which is further extended from the apex of the V-shaped substance, it is necessary to optimize conditions of the constitution.

SUMMARY OF THE INVENTION

The present invention is made in consideration of the conventional problems described above. It is directed to provide a solar module which has a fixed type solar concentrator of high converging magnification.

In order to achieve the object described above, according to a first aspect of the present invention, there is provided a solar module comprising:

a solar concentrator being composed of a pair of prisms each of which is constituted by a transparent member whose refractive index is larger than that of air, has a triangular section, and converges sunlight by utilizing reflection and total internal reflection, wherein a V shape is formed by the aforementioned pair of prisms and a solar cell is arranged on the bottom face of an extension which is extended further from the apex of the V shape.

Further, according to a second aspect of the present invention, in the solar module of the first aspect, a V groove extending in a longitudinal direction is formed on the apex of the V shape.

Further, according to a third aspect of the present invention, in the solar module of the first aspect, the extension has a refractive index larger than those of the prisms.

Further, according to a fourth aspect of the present invention, in the solar module of the third aspect, an interface between the extension and the prisms has a convex shape on the side of the prisms.

Further, according to a fifth aspect of the present invention, in the solar module of the first aspect, a mirror surface is formed on a back which is the opposite side of an incident surface of each of the prisms.

Further, according to a sixth aspect of the present invention, in the solar module of the first aspect, a layer for adhesives is provided between the solar battery and the extension.

Further, according to a seventh aspect of the present invention, in the solar module of the first aspect, a triangular cavity which is an upside-down image of the prisms' sections is provided inside the prisms.

Further, according to an eighth aspect of the present invention, in the solar module of the seventh aspect, a substance whose refractive index is smaller than those of the prisms is filled in the cavity.

Further, according to a ninth aspect of the present invention, there is provided a solar module comprising:
- a solar concentrator being composed of a prism which is constituted by a transparent member having a refractive index larger than that of air, has a triangular section, and performs convergence by utilizing reflection and total internal reflection,
- wherein the prism has a polarizer for polarizing incident sunlight in a direct-on in which an incident angle to the prism becomes large.

Further, according to a tenth aspect of the present invention, in the solar module of the ninth invention, the polarizer is a Fresnel lense.

Further, according to a eleventh aspect of the present invention, in the solar module of the tenth aspect, a surface which is sandwiched between an incident surface and a bottom face of the Fresnel lens is tilted to the incident surface of the prism by a prescribed angle.

Further, according to a twelfth aspect of the present invention, in the solar module of the ninth aspect, the prism is arranged so that the incident surface of the prism is horizontal.

Further, according to a thirteenth aspect of the present invention, in the solar module of the ninth aspect, a perpendicular which is sandwiched between an incident surface and a bottom face of the Fresnel lens is a reflection surface.

Further, according to a fourteenth aspect of the present invention, in the solar module of the ninth aspect, the polarizer is a triangular prism.

Further, according to a fifteenth aspect of the present invention, in the solar module of the first aspect or the ninth aspect, a convex notch is provided on an area which is a prism portion of an interface between the prism and the solar battery and is the prism side of a part corresponding to an electrode position of the solar battery.

DESCRIPTION OF THE PREFERRED EMBODIMENTS

Preferred embodiments of the present invention will be subsequently described with reference to accompanying drawings.

First Embodiment

Figure 1:
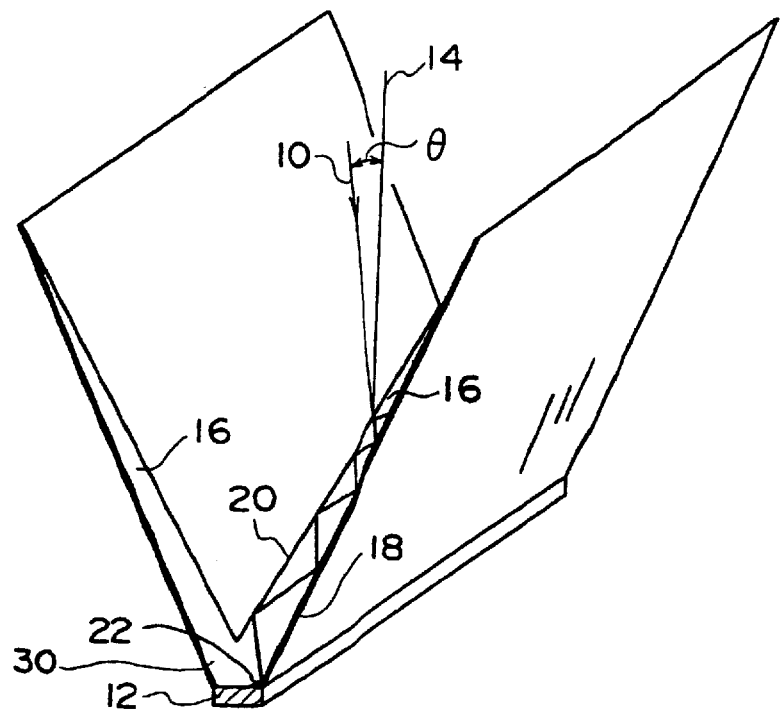
FIG. 1 is a cut-away view showing a first embodiment of a solar concentrator according to the present invention.

FIG. 1 is a cut-away view showing the solar concentrator according to a first embodiment of the present invention. In the solar concentrator of this embodiment shown in FIG. 1, a pair of prisms 16 are arranged facing each other and formed in a V shape which is extended in a longitudinal direction. At the apex of the V shape, there is provided an extension 30 where a solar cell 12 is installed. These prisms 16 are formed in such a manner that their wall thickness will increase towards the apex of the V shape. Further, a mirror surface 18 is formed at a periphery of each of the prisms 16, namely, on the back side of an incident surface 20 of sunlight 10. The mirror surface 18 is formed by evaporating a reflection film, such as silver or aluminum, directly from the back of prism 16 which is the other side of the incident surface 20, or by sticking a mirror to the back.

Figure 2:
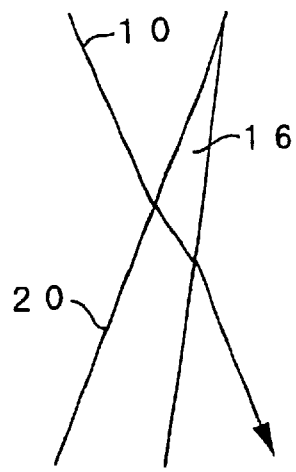
FIG. 2 is an explanatory drawing which shows an aspect of transmission of sunlight in a case where there is no mirror surface in the solar concentrator shown in FIG. 1.

In the case that the mirror surface 18 is not formed on the back, when an incident angle θ which is an angle between a normal line 14 made against the solar cell 12 and the incident sunlight 10 is increased, the incident sunlight is transmitted to the outside through the back side of the prism 16 as shown in FIG. 2. For the above reason, the aforementioned mirror surface 18 is formed and therefore the sunlight which may be transmitted to the outside through the backside is caused to reflect and return to the inside of the prism 16.

Figure 16:
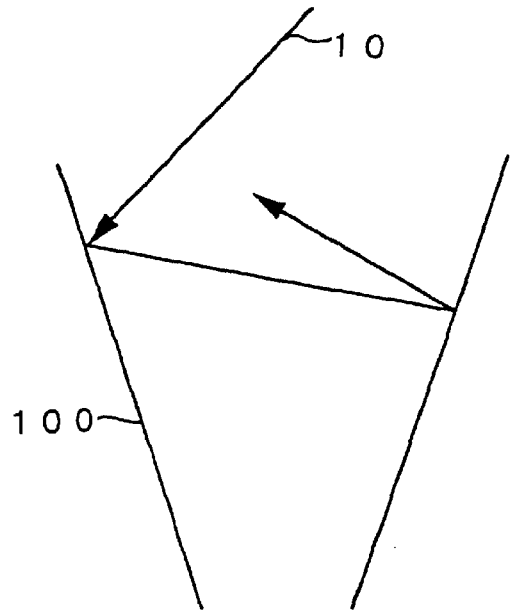
FIG. 16 is an explanatory drawing which shows an aspect of the reflection of sunlight on a conventional reflection type solar concentrator having a tapering shape.
Figure 17:
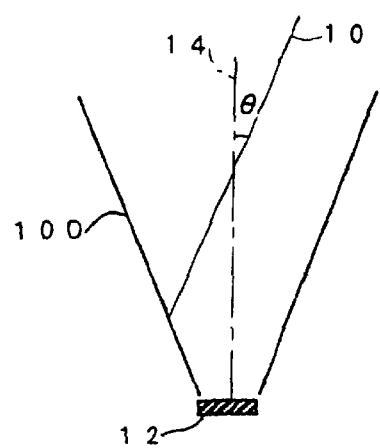
FIG. 17 exemplifies a combination of a solar cell and the solar concentrator shown in FIG. 16.
Figure 18:
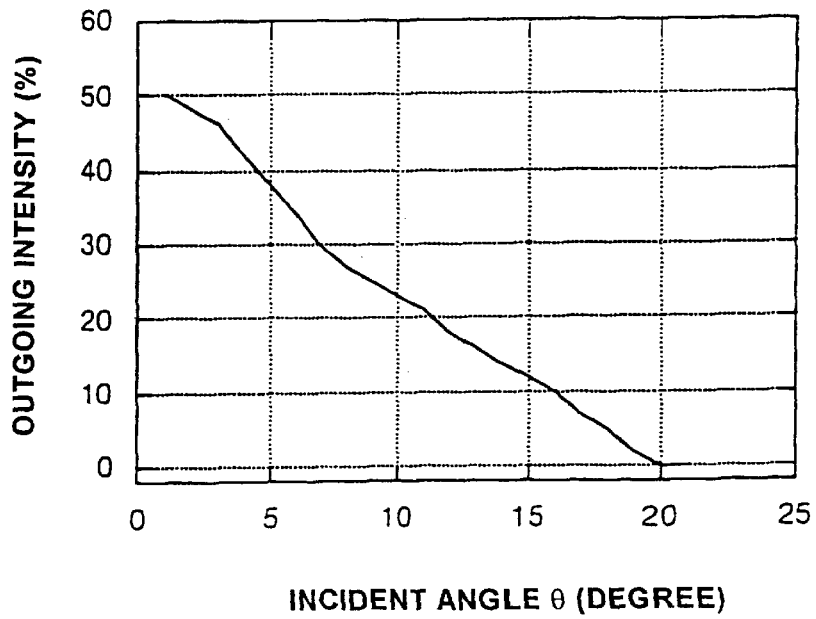
FIG. 18 shows a relation between an incident angle and an outgoing intensity in the solar concentrator shown in FIG. 17.
Figure 19:
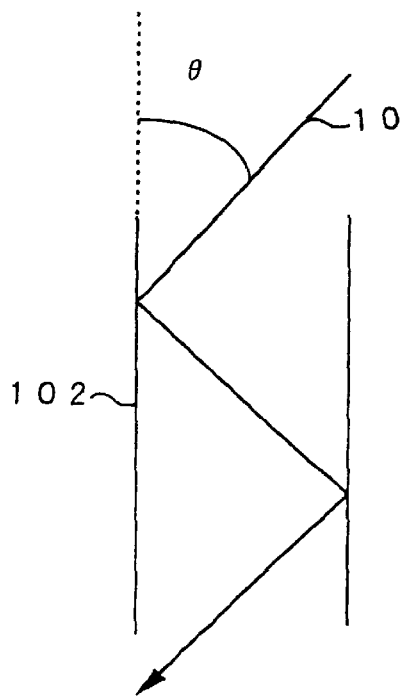
FIG. 19 shows a state of the progress of sunlight in the reflection type solar concentrator in a case where reflection surfaces are arranged in parallel.
Figure 20:
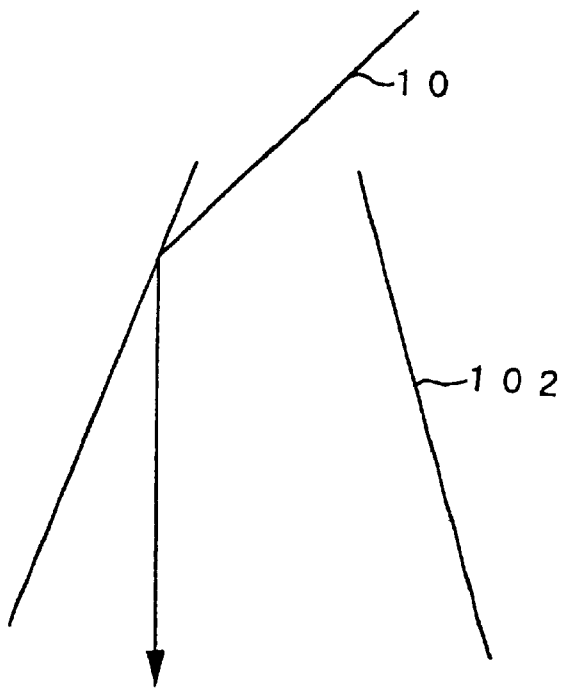
FIG. 20 shows a state of the progress of sunlight in the reflection type solar concentrator in a case where reflection surfaces widen toward an outgoing port.
Figure 21:
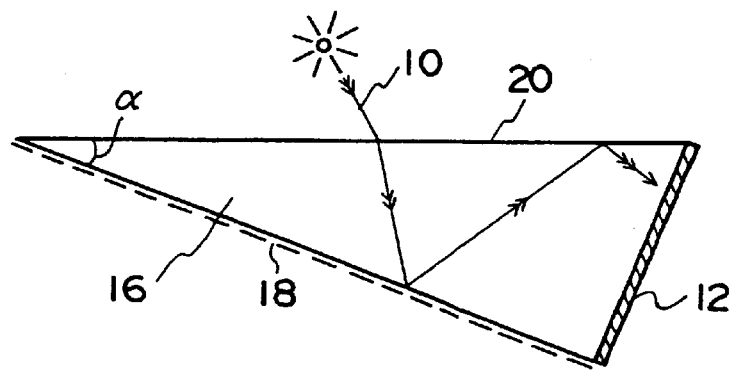
FIG. 21 is the section of a conventional solar concentrator which performs convergence by repeating reflection and total internal reflection.
Figure 22:
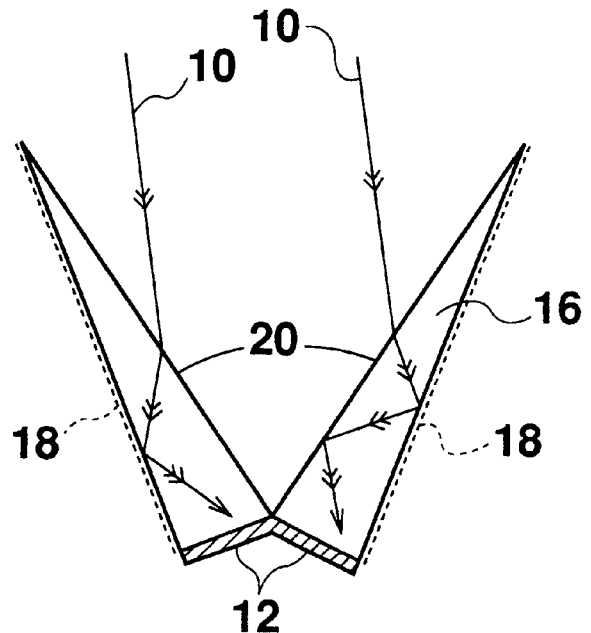
FIG. 22 shows an example of constitution having a couple of solar concentrators arranged facing each other in a V shape.

The prism 16 is composed of materials whose refractive index is larger than that of air, for example transparent resin or glass. Therefore, the incident sunlight 10 from the incident surface of the prism 16 reflects on the mirror surface 18, returns to the incident surface 20 again, and then performs total internal reflection thereon, as described above. In this case, the mirror surface 18 and the incident surface 20 are arranged in such a manner that the distance between them widens toward the solar cell 12. Therefore, unlike the case shown in FIG. 16, the incident sunlight 10 will not go out in a direction of incidence again during the repetition of such reflection. Therefore, reflection on the mirror surface 18 and total internal reflection on the incident surface 20 are repeatedly carried out. As shown in FIG. 1, the sunlight 10 then reaches an extension 30 at the apex of the V shape, and outgoing light 22 emerges to the solar cell 12 at the lower end.

Figure 3:
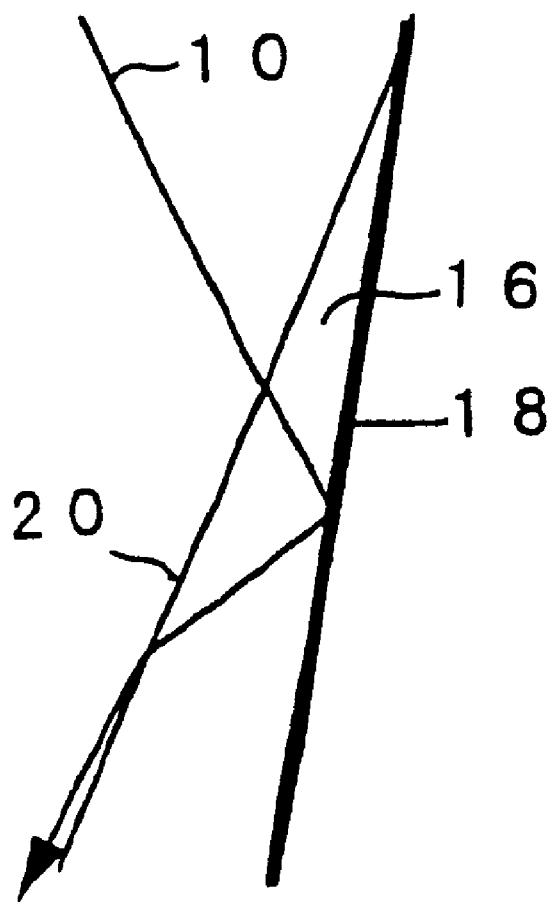
FIG. 3 is an explanatory drawing which shows an aspect of reflection on a mirror surface in the concentrator shown in FIG. 1.

As described above, as the distance between the mirror surface 18 and the incident surface 20 widens toward the solar cell 12, the total internal reflection on the incident surface 20 occurs easily. However, if the incident angle θ increases too much as shown in FIG. 3, conditions of the total reflection on the incident surface 20 will not be satisfied after the reflection on the incident surface. Therefore, the sunlight 10 is transmitted to the outside through the incident surface 20. Also, it goes out in the direction of the incidence from an opening between a pair of prisms, which constitute the V shape, due to the principle shown in FIG. 3. Thus, there is a certain optimum range for the incident angle θ of the sunlight 10.

With regard to a range of the incident angle θ, if a range of ±24 degrees to a normal line 14 which is defined against the solar cell 12 is secured, a variation of the incident angle due to the change of seasons, namely declination, will be ±23.4°. Thus, convergence can be perfectly achieved. On the other hand, since movement of the sun in a day, namely an hour angle, is 180°, it is impossible to perfectly follow up the movement. However, as a measure for the variation of angles of the sun, as shown in FIG. 1, a solar concentrator is extended in a longitudinal direction so as to converge the sunlight as much as possible. Due to the constitution described above, convergence of the sunlight is possible even though tracking of the sun by shifting the solar concentrator is not carried out. Consequently, a solar concentrator of high converging magnification can be realized.

In the solar concentrator of this embodiment, due to the utilization of total internal reflection, intensity of light will not be extremely decreased even though reflection is repeated. On the other hand, since the mirror surface is used for the reflection on the back side, when the incident angle θ becomes large, the intensity of light decreases by a reflectance on the mirror surface 18. However, if aluminum or silver is used, each of which has a high reflectance, it will be possible to ensure approximately 90 percent of the reflectance.

Figure 4:
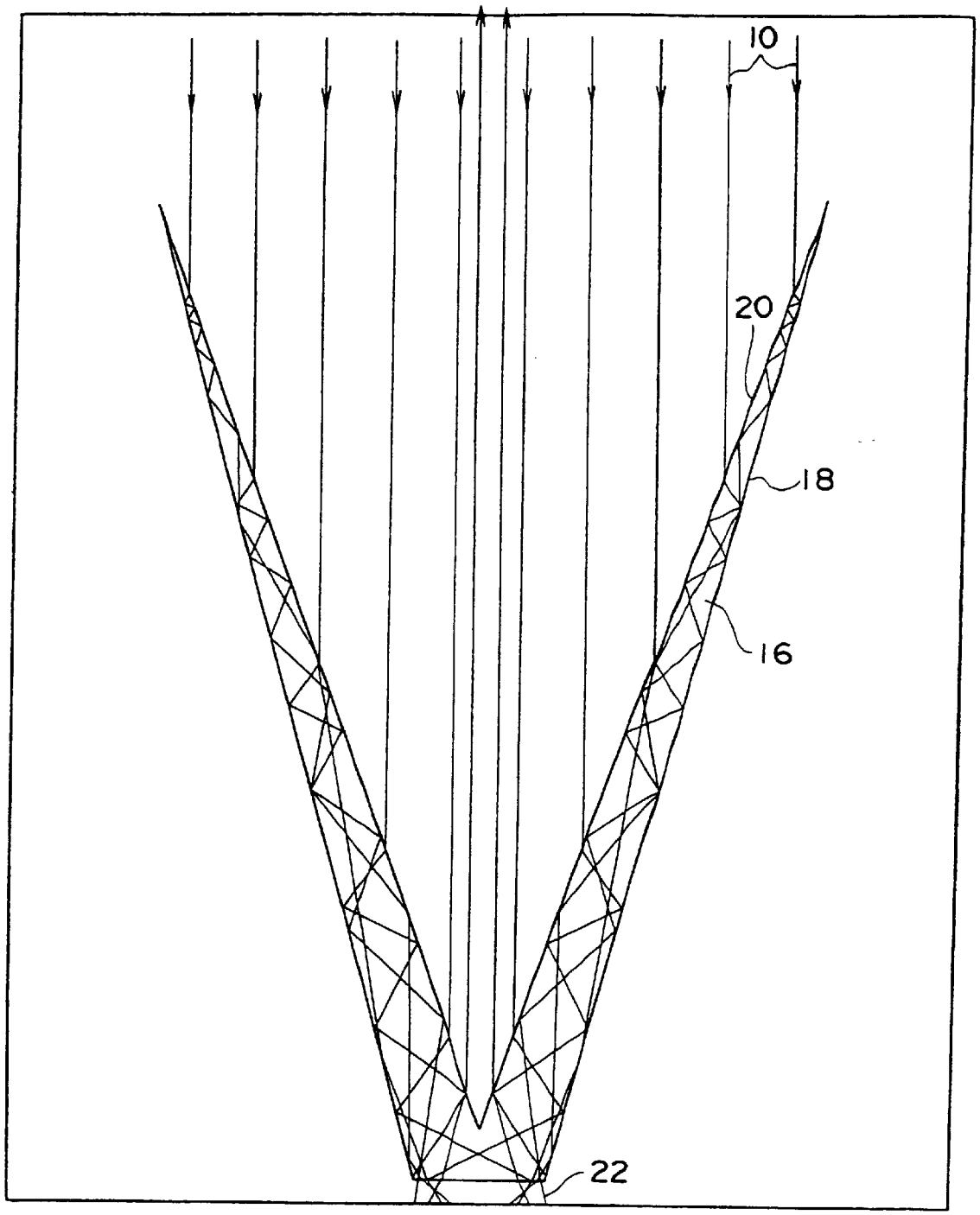
FIG. 4 shows a result of simulation experiment illustrating an aspect of convergence performed by the solar concentrator of FIG. 1.
Figure 5:
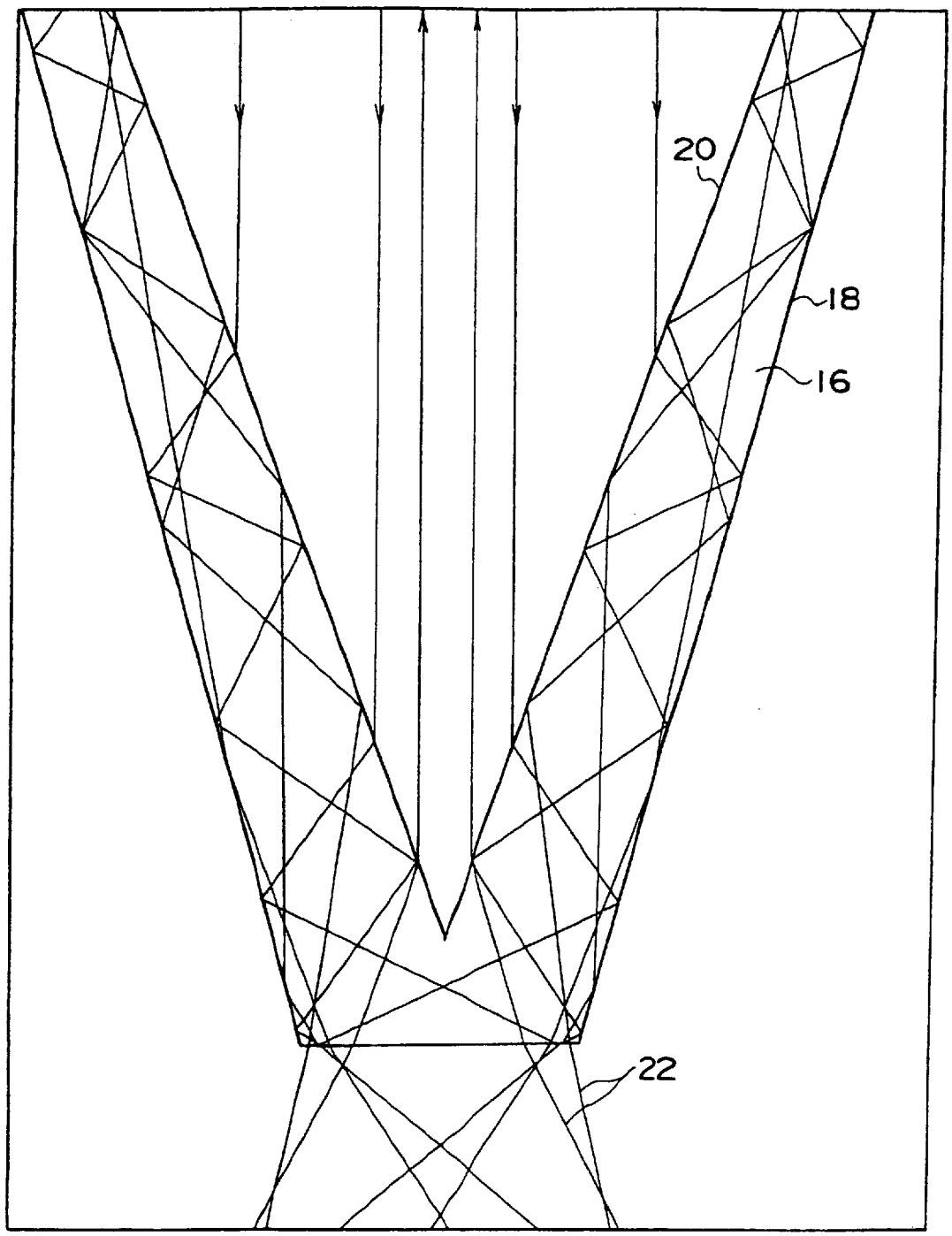
FIG. 5 is an enlarged view of FIG. 4.

Performance of such a solar concentrator according to this embodiment is determined by its configuration and the refractive index of the prism 16. Here, a simulation experiment of a case in which the refractive index is set to polycarbonate 1.59, for example, and ten rays of light are let in is carried out. The outcome of the simulation experiment is shown in FIG. 4 and FIG. 5, respectively. Incidentally, FIG. 5 is an enlarged view of FIG. 4. In the example shown in FIGS. 4 and 5, under the condition "θ=0°," out of ten rays of light, two rays go out in a direction of incidence and eight rays emerge from the bottom as outgoing light 22.

Figure 6:
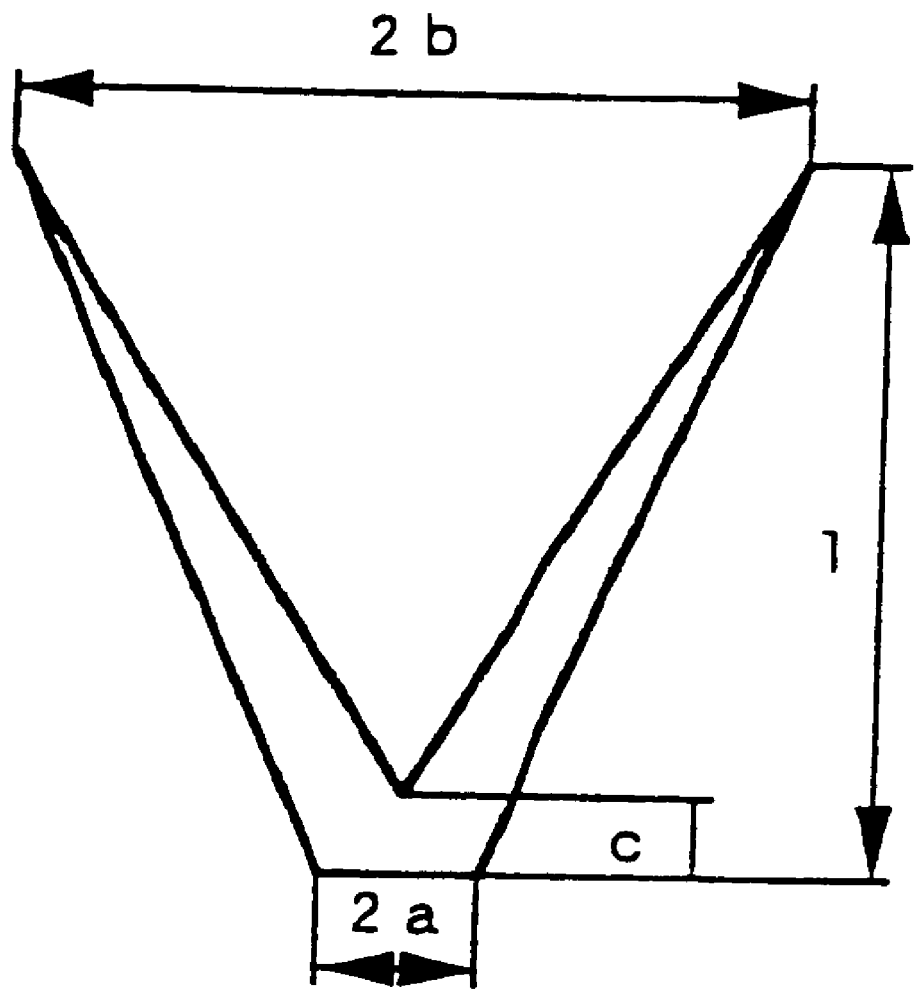
FIG. 6 is an explanatory drawing which shows each factor to determine a configuration of the solar concentrator shown in FIG. 1.

In this simulation experiment, as shown in FIG. 6, a width of outgoing port "a," a width of incident port "b," a depth of the extension "c," and a height of the solar concentrator "1" are selected as factors for determining the configuration of the solar concentrator according to this embodiment. As a fundamental configuration, values are set as follows: a=4 mm; b=20 mm; c=3 mm; and 1=60 mm. The outgoing intensity is computed as a ratio of the outgoing sunlight from the bottom to the incident sunlight, and the relation with the incident angle is studied. In this example, one dimensional convergence is performed as shown in FIG. 1.

Figure 7:
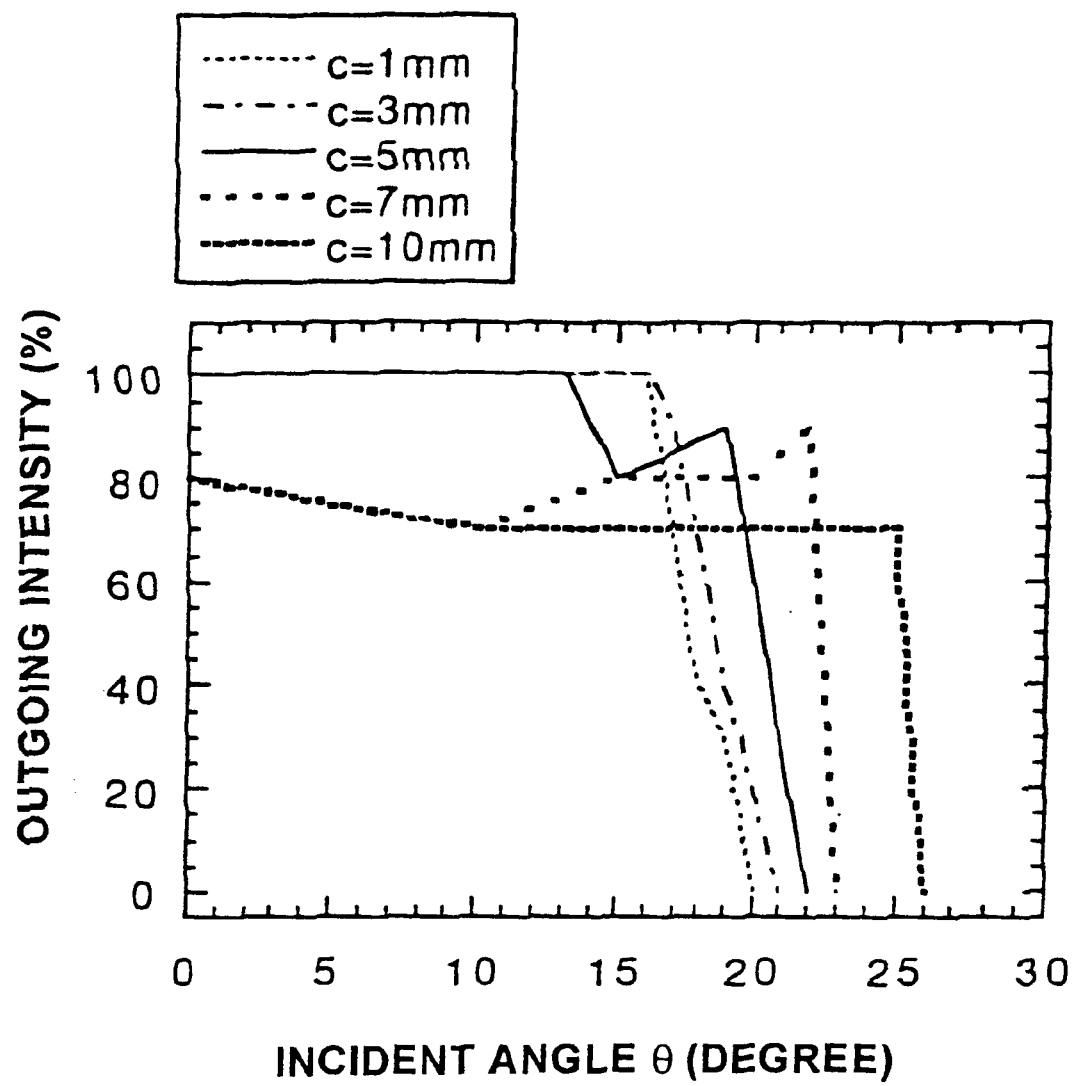
FIG. 7 shows a relation between an incident angle and an outgoing intensity when a value c is varied in FIG. 6.

FIG. 7 shows a relation between an incident angle and an outgoing intensity in a case where only the depth of extension c is changed. In FIG. 7, as the value of c increases, the outgoing intensity decreases as a whole. However, if the value of c becomes greater, the outgoing intensity can be maintained at a fixed level up to a wider incident angle. The following are believed to be the cause. When the value c becomes large, a portion of the tapering shape in the extension 30 becomes long. Thus, an amount of sunlight which goes out in a direction of incidence increases, and the outgoing intensity weakens. However, since the distance between the mirror surface 18 and the incident surface 20 becomes wider at the solar cell, total internal reflection on the incident surface 20 is performed more easily, thereby enabling the convergence even at a large incident angle. Therefore, it is optimum to select the smallest value of c which can secure a desired value of incident angle, for example an incident angle of 24 degrees, for the purpose of covering the declination of the sun.

Figure 8:
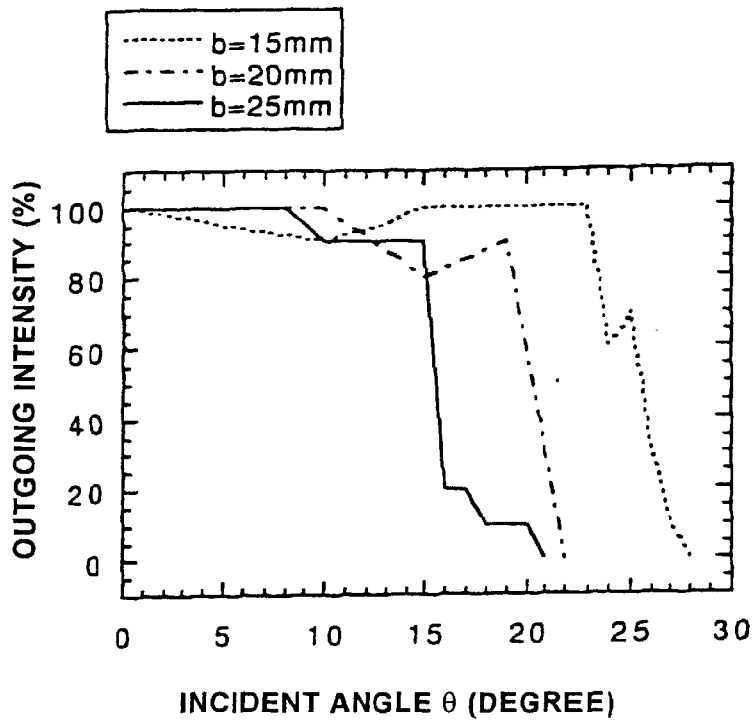
FIG. 8 shows a relation between an incident angle and an outgoing intensity when a value b is varied in FIG. 6.

FIG. 8 shows the relation between an incident angle and an outgoing intensity in a case where only the width of incident port b is altered in FIG. 6. In FIG. 8, the value of a is fixed to be 4 mm which is for the case of fundamental configuration, whereas the value of b is altered. As is clear from FIG. 8, the more a degree of convergence increases due to the increase in value of b, the more an outgoing intensity decreases at a small incident angle. In order to maintain a full intensity of incidence up to an incident angle of 25 degrees, the value of b has to be 15 mm. In this case, the degree of convergence will be 3.75 (15/4). The following can be considered as the reason. When the value of b increases, the mirror surface leans to the outer side. Thus, an incident angle to the mirror surface 18 is small, in other words, sunlight comes in at almost a right angle, whereby it becomes difficult for the sunlight which reflects on the mirror surface 18 to perform total internal reflection on the incident surface 20. Moreover, the tapering degree at the extension 30 becomes more extreme.

Figure 9:
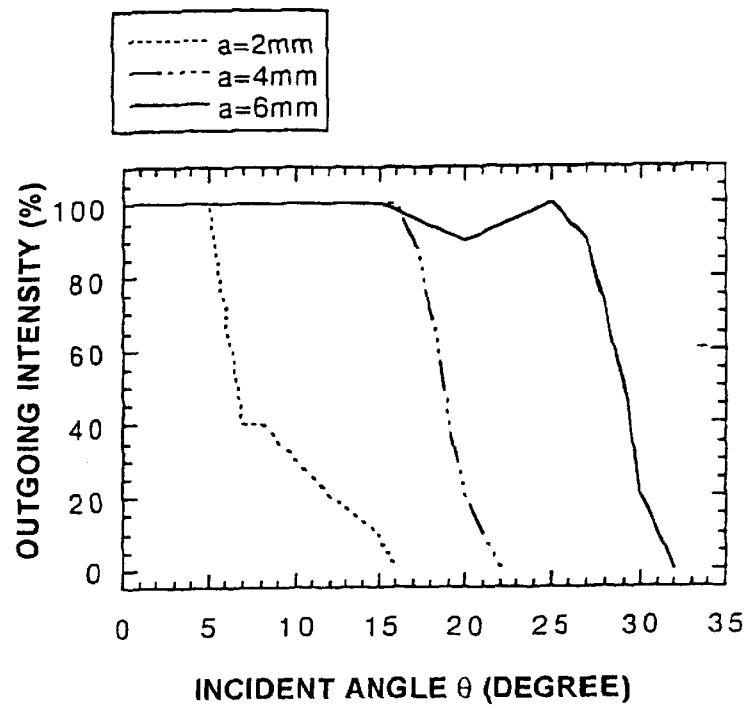
FIG. 9 shows a relation between an incident angle and an outgoing intensity when a value a is varied in FIG. 6.

FIG. 9 shows the relation between an incident angle and an outgoing intensity in a case where only a width of outgoing port a is altered in FIG. 6. In FIG. 9, the value of b is fixed to be 20 mm which is for the case of fundamental configuration, whereas the value of a is altered. As is clear from FIG. 9, it is considered that full outgoing intensity at an incident angle of 24 degrees is achieved up to 5 mm in the width of outgoing port a, namely, about four times in a degree of convergence. Thus, judging from the outcome shown in FIGS. 8 and 9, it makes no great difference to the outcome whether a is altered or b is altered as long as the degree of convergence is fixed. When the value of a decreases, the value of b relatively increases. Therefore, increase in the value of b in FIG. 8 is the same as decrease in the value of a in FIG. 9 in terms of the effect.

Figure 10:
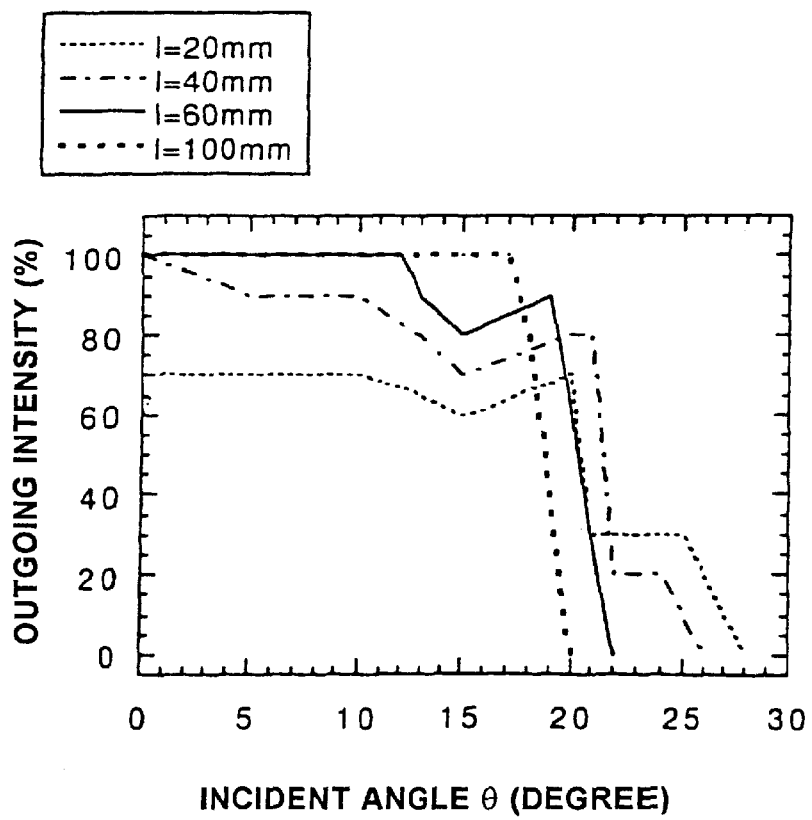
FIG. 10 shows a relation between an incident angle and an outgoing intensity when a value 1 is varied in FIG. 6.

FIG. 10 shows the relation between an incident angle and an outgoing intensity in a case where only a height of the solar concentrator 1 is altered. In FIG. 10, an overall outgoing intensity decreases when the value of 1 is small, but a fixed outgoing intensity is maintained up to a large incident angle. When the value of 1 becomes large, a degree of widening the distance between the mirror surface 18 and the incident surface 20 at the solar cell is reduced, whereby it becomes difficult to carry out total internal reflection on the incident surface 20. On the other hand, when the value of 1 decreases, a tapering degree at the extension increases, whereby an amount of sunlight which goes out in a direction of the incidence is increased. Relative equilibrium of these values leads to the outcome mentioned above. Therefore, it will be more advantageous if the value of 1 is greater. However, over 60 mm is sufficient in consideration of the right balance between installation space and performance.

Figure 11:
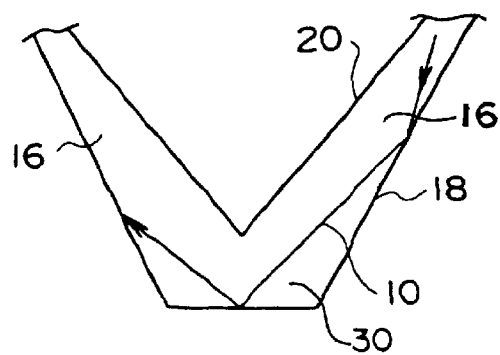
FIG. 11 shows an aspect of the reflection of sunlight on the bottom of the solar concentrator shown in FIG. 1.
Figure 12:
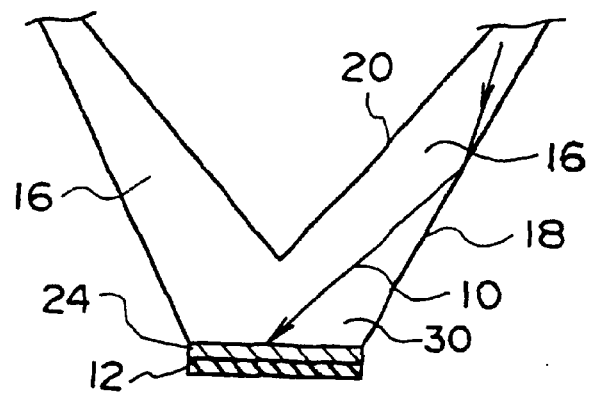
FIG. 12 shows a state of the progress of sunlight in a case where air existing at the bottom is removed in FIG. 11.

In the aforementioned solar concentrator according to this embodiment, since the prism 16 has a high refractive index, as shown in FIG. 11, the sunlight 10 which has reached the bottom of the extension 30 may go out in the direction of incidence again due to total internal reflection on the bottom. This is because a layer of air exists at the bottom. Therefore, as shown in FIG. 12, the total internal reflection can be prevented by filling up a layer of adhesives 24 between the solar cell 12 and the extension 30 of the prism 16 so as to remove the layer of air. Due to such a constitution, it is possible to permit all of the sunlight 10, which advances in the prisms 16 by performing repetitive reflection and reaches the bottom, to enter the solar cell 12 without going through total internal reflection on the bottom of the extension 30.

Figure 13:
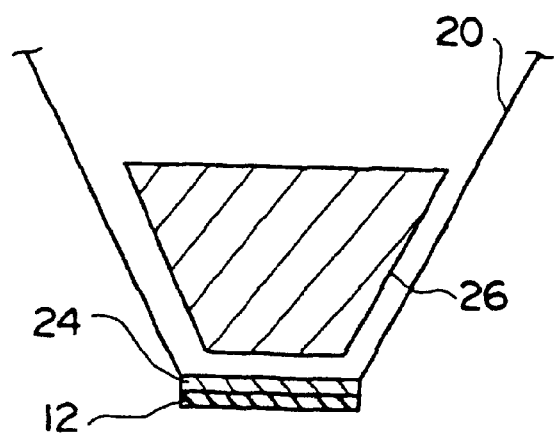
FIG. 13 exemplifies a cooling method in a case where a solar cell and the solar concentrator shown in FIG. 1 are combined.

FIG. 13 shows a cooling method of the solar cell 12 in a case of combination of the solar cell 12 and the solar concentrator according to this embodiment. In FIG. 13, the solar cell 12 is cooled by making coolant 26 run through the apex of V shape of the solar concentrator. It is also preferable to cool the solar cell 12 from the back side of the cell by means of a cooling pipe through which coolant runs (not shown in drawings).

Second Embodiment

Figure 14:
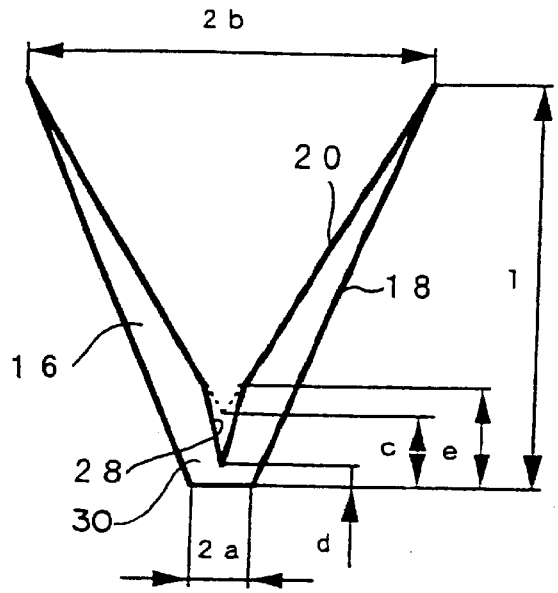
FIG. 14 is a section of the solar concentrator according to a second embodiment of the present invention.

FIG. 14 is a section showing the solar concentrator according to a second embodiment of the present invention. This embodiment is characterized in that a V groove 28 which extends in a longitudinal direction is formed on the apex of the V shape which is composed of a pair of prisms 16. The extension of the prisms 16 is sandwiched between two mirror surfaces 18 and has a tapering shape. However, as shown in FIG. 14, if the V groove 28 is formed on the apex, a degree of taper in shape of the extension 30 will be moderated, thereby decreasing an amount of sunlight which returns in the direction of incidence by a portion corresponding to the degree of moderation. Even in such a case that converging magnification is raised by increasing the width of incident port b or decreasing the width of outgoing port a in FIG. 14, the reduction of outgoing intensity resulting from the increase of incident angle is not so remarkable as the case shown in FIGS. 8 and 9 since the degree of taper in shape of the bottom of the extension 30 of the prisms 16 is moderated. Consequently, in the solar concentrator of this embodiment, it is possible to improve the converging magnification even further.

An examination was made to find the relation between an incident angle and an outgoing intensity in the case where a width of outgoing port a, a width of incident port b, a depth of extension c, a depth of the underneath of V groove d, a height of opening of the V groove e, and a height of solar concentrator 1 are altered. In this study, it was assumed that the refractive index is fixed to be 1.59 in the same way as the first embodiment.

The study was made of three kinds of shapes which will be shown in the following table.

TABLE 1

| MODE 1 | a = 5 | b = 25 | c = 10 | d = 3 | e = 30 | l = 70 |
| --- | --- | --- | --- | --- | --- | --- |
| MODE 2 | a = 5 | b = 25 | c = 10 | d = 3 | e = 15 | l = 70 |
| MODE 3 | a = 5 | b = 23 | c = 10 | d = 3 | e = 15 | l = 70 |

Figure 15:
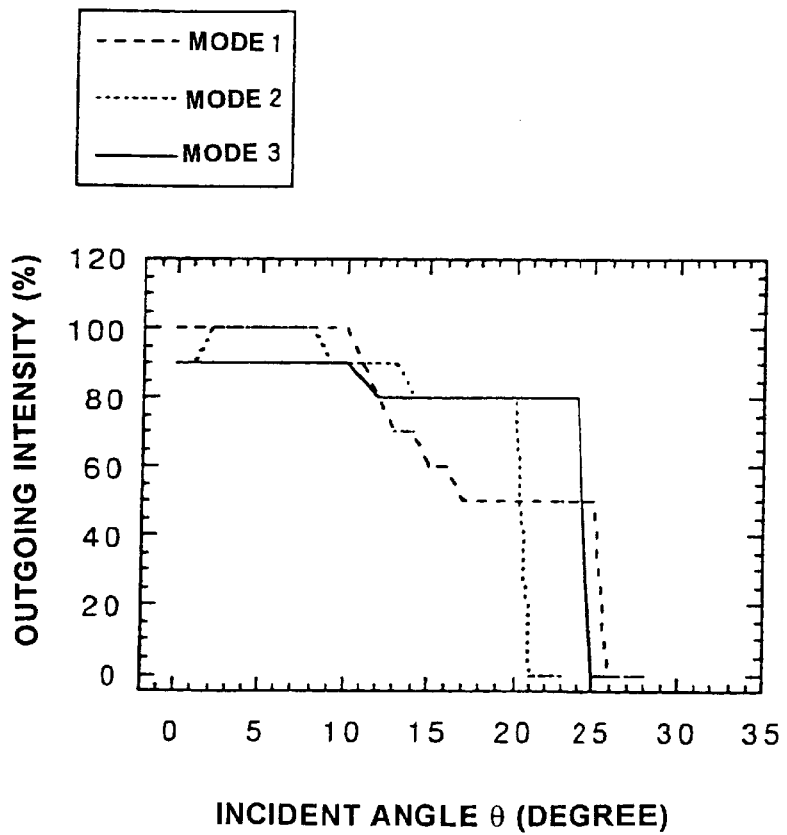
FIG. 15 shows a relation between an incident angle and an outgoing intensity when a configuration of the solar concentrator shown in FIG. 14 is altered.

FIG. 15 shows the relation between an incident angle and an outgoing intensity in the aforementioned three kinds of modes. In FIG. 15, 80 to 90 percent of the outgoing intensity can be maintained at an incident angle of 24 degrees in the case of mode 3. The converging magnification in the case of mode 3 is 4.6, which is improved compared with the case of the first embodiment mentioned above.

Third Embodiment

Figure 23:
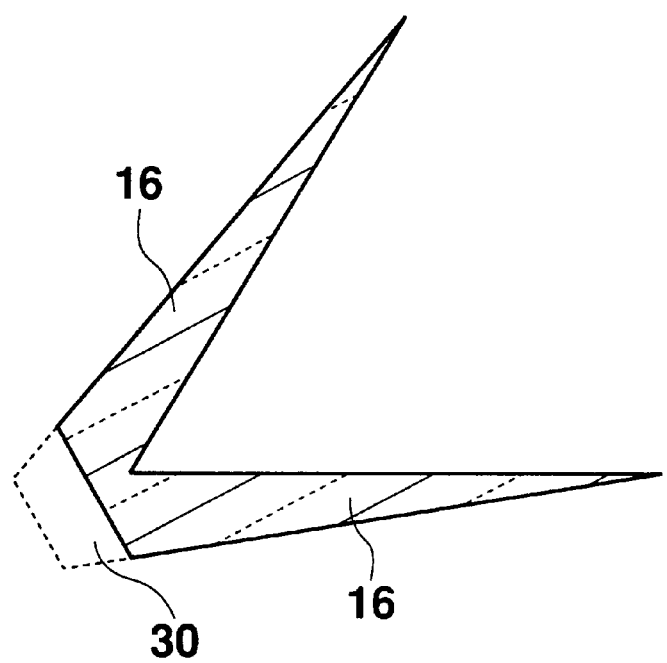
FIG. 23 exemplifies a constitution having a bottom face of the V-shaped solar concentrator, which is composed of a pair of triangular prisms, extended.
Figure 24:
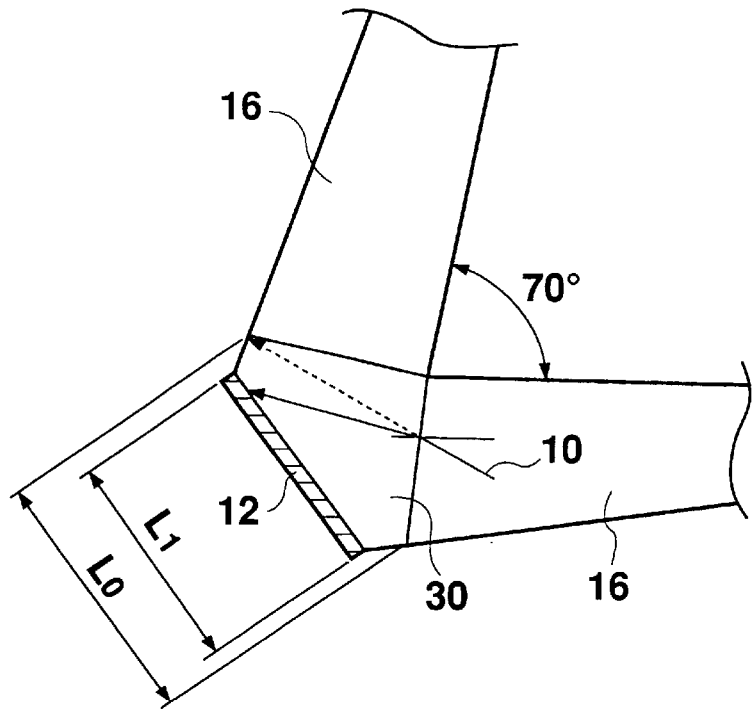
FIG. 24 is a section of the solar module according to a third embodiment of the present invention.

FIG. 24 is a section showing the solar module according to a third embodiment of the present invention. In the aforementioned embodiments 1 and 2, optimum conditions of the extension 30 shown in FIG. 23 are determined. In contrast, in this embodiment, no particular restrictions are placed on the shape of the extension 30, and measures for a refractive index of that part are taken.

More specifically, the constitution is such that a material which has a refractive index larger than that of the prisms 16 is used for the extension 30 and a pair of prisms 16 are connected with the extension 30. Due to such a constitution, as shown in FIG. 24, the incident sunlight 10 is refracted on the solar cell side at an interface between the prism 16 and the extension 30. If a width of the joint of the extension 30 to the prisms 16 is designated by $L_0$ and a width of the bottom of the prism 16, namely, a width of the surface on which the solar cell 12 is provided is designated by $L_1$, it will be possible to make $L_1$ smaller than $L_0$. Therefore, an area of the solar cell 12 can be reduced and the converging magnification can be improved in proportion to the reduction.

In the constitution in which a pair of prisms 16 are combined and arranged in a V shape like this embodiment, if the interior angle of the V shape is 70 degrees, most of the sunlight can be converged with the solar concentrator fixed.

Figure 25:
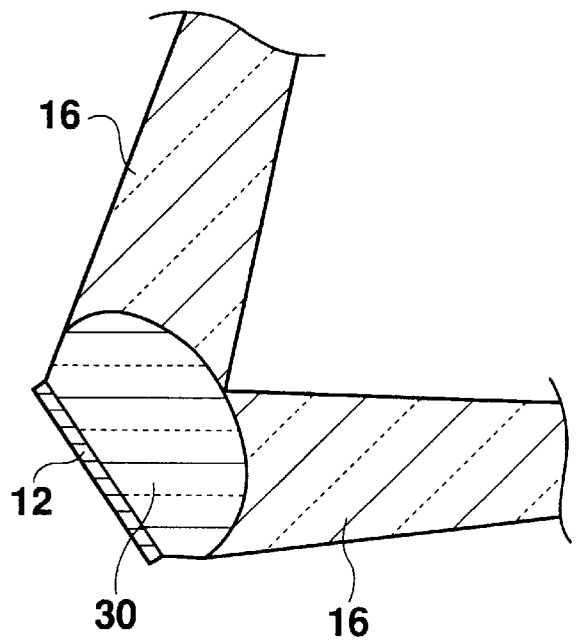
FIG. 25 is a section showing a modification of the solar module according to the third embodiment of the present invention.

Further, FIG. 25 shows a modification of this embodiment. In FIG. 25, the interface of a joint of the prisms 16 and the extension 30 is formed in a convex curve on the side of prisms 16. Due to such a constitution, the sunlight 10 can be refracted further on the solar cell side 12 and an area of the bottom of the extension 30 can be reduced, whereby converging magnification can be improved even further.

In this embodiment, as a material of the prisms 16, for example, PMMA resin having a refractive index of 1.50 is used, and as a material of the extension 30, for example, polycarbonate (PC) resin having a refractive index of 1.59 is used. Simulation computation using engineering software was carried out for a case where one hundred rays of sunlight were caused to enter the prisms 16 at regular intervals and different angles in such a constitution. As a result, it was verified that almost all the sunlight reached the solar cell 12 up to approximately "$L_1/L_0 = 0.9$." Therefore, a bottom area of the extension 30 can be reduced by approximately 10 percent of a joint area of the extension 30 to the prisms 16, whereby the converging magnification can be improved by approximately 10 percent.

Fourth Embodiment

Figure 26:
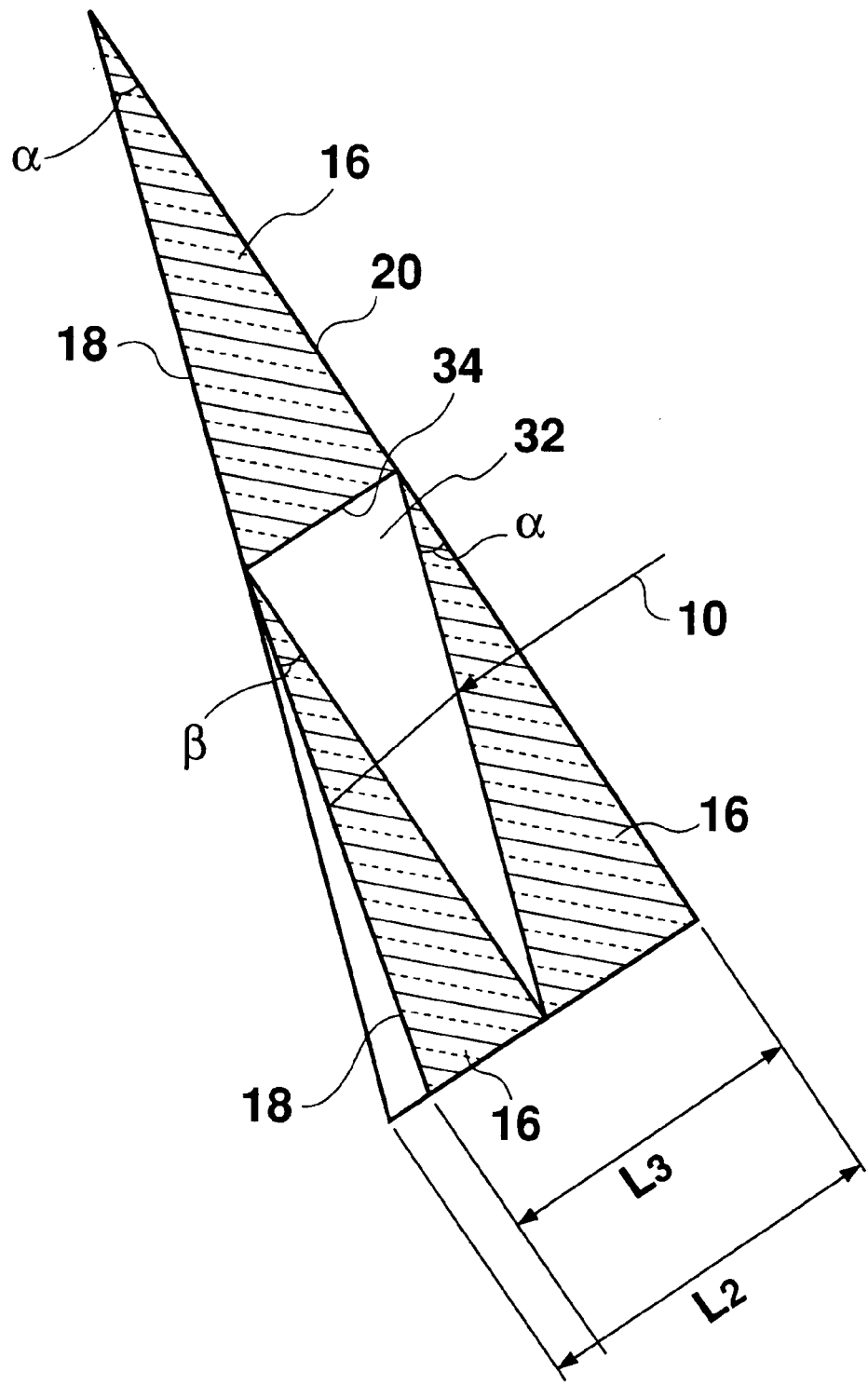
FIG. 26 is a section showing constitution of the solar module according to a fourth embodiment of the present invention.

FIG. 26 is a section showing the solar concentrator according to a fourth embodiment of the present invention.

FIG. 26 shows one of a pair of prisms 16 in the solar module shown in FIG. 24. This embodiment is characterized in that a triangular cavity 32 which is an upside-down image of the section of the prism 16 is provided inside the prism 16. In this embodiment, the mirror surface 18 is formed on the opposite side of the incident surface 20 where the sunlight 10 enters, and the sunlight 10 enters the solar cell which is not shown in the drawing after repeating reflection and total internal reflection on the mirror surface 18 and the incident surface 20.

In this embodiment, a substance, such as water, which has a refractive index smaller than that of the prism 16 is filled inside the cavity 32. Therefore, when the sunlight 10 enters the incident surface 20 at right angles, it is refracted twice at the interface between the prism 16 and the cavity 32, and enters the mirror surface 18 in such a manner that it is inclined to the direction of the bottom of the prism 16, namely, to the direction of the solar cell. Therefore, the sunlight which reflects on the mirror surface 18 advances in a direction which facilitates total internal reflection on the incident surface. This enables an angle $\beta$, which is formed by a part of the mirror surface 18 and the cavity, to be smaller than an angle $\alpha$. Thus, a width of the bottom of the prism 16 can be reduced from the original $L_2$ to $L_3$. As a result, an area of the bottom of the solar concentrator which is composed of the prism 16 according to this embodiment can be made smaller than that of the constitution without the cavity 32, whereby the converging magnification can be improved by the portion of the decrease.

When the prism 16 is arranged in a V shape as shown in FIG. 24, an actual incident angle of the sunlight 10 incident on the incident surface 20 is minimum 20 degrees to the normal line which is defined against the incident surface 20. Total internal reflection is most unlikely to occur at this angle. Assuming that for example, PMMA resin is used as a material of the prism 16 and the cavity 32 is not provided in this case, an apex angle $\alpha$ of the prism 16 has to be 14.3 degrees in order to meet the conditions of total internal reflection on the incident surface 20. On the other hand, if the cavity 32 is provided and water having a refractive index of 1.33 is filled therein like this embodiment, the conditions of total internal reflection will be satisfied even though an angle $\beta$ which is formed between the mirror surface 18 and the cavity 32 is 12.2 degrees. Therefore, an area of the bottom of the prism 16 can be reduced by 15 percent in the area corresponding to the angle $\beta$ and 7.5 percent onverall. If the cavity 32 is filled with air which differs, significantly from the prism in refractive index, total internal reflection will occur on the perpendicular 34 of the cavity 32, thereby decreasing the converging magnification in proportion. For the purpose of preventing the decrease of the converging magnification, water is filled in the cavity 32.

Fifth Embodiment

Figures 27A, 27B:
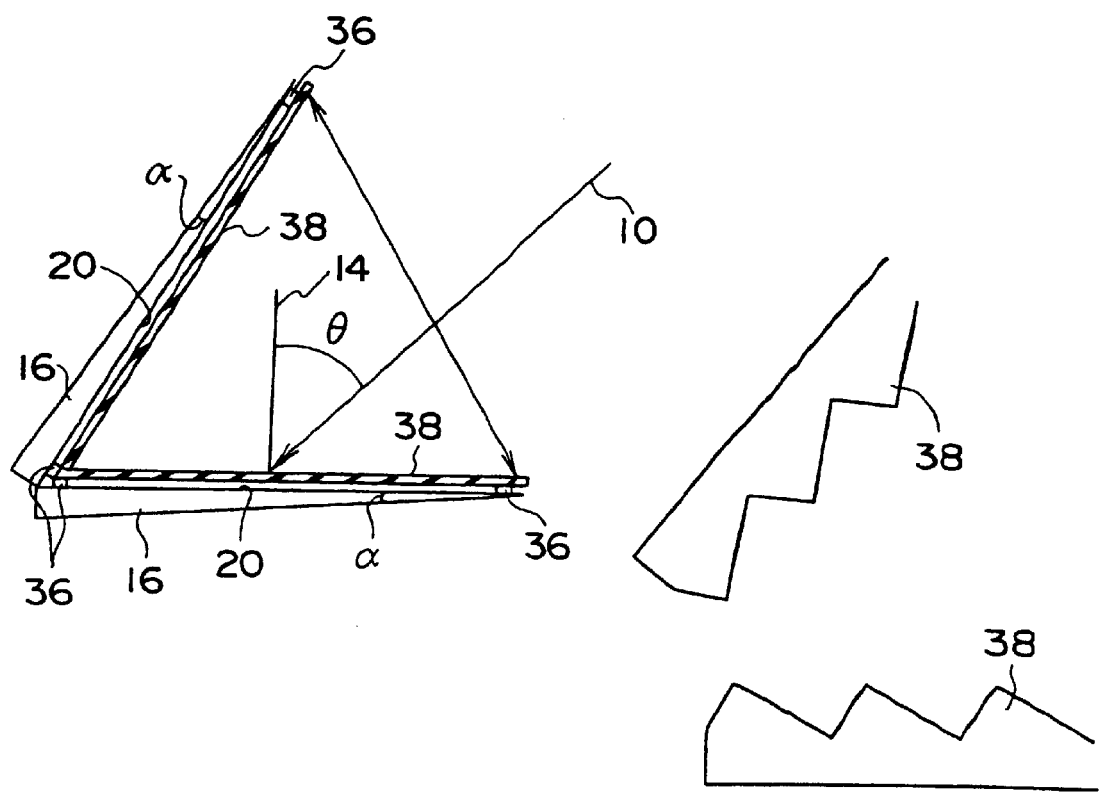
FIG. 27A is a section showing constitution of the solar module according to a fifth embodiment of the present invention.
FIG. 27B is an enlarged drawing of a Fresnel lens.

FIGS. 27A and 27B are sections showing the solar module according to a fifth embodiment of the present invention. In FIG. 27A, on the side of the incident surface 20 of a pair of prisms 16, a Fresnel lens 38 as a polarizer is arranged via a transparent spacer 36. FIG. 27B is an enlarged drawing of the Fresnel lens 38. In this embodiment, sunlight 10 which enters at an angle of $\theta$ to the normal line 14 defined against the incident surface is refracted by the Fresnel lens 38 prior to the incidence on the prism 16, whereby the incident angle on the prism 16 becomes larger. This facilitates the occurrence of total internal reflection on the incident surface 20 of the prism 16, thereby enabling reduction of apex angle $\alpha$ of the prism 16. Therefore, it is possible to reduce an area of the bottom of the prism 16, namely, an area of the solar cell (not shown in the drawing), whereby the converging magnification can be improved.

If refraction of sunlight can be achieved so that the sunlight incident on the Fresnel lens 38 at an angle θ of 20 degrees will enter the incident surface 20 at an angle of 26.2 degrees, the apex angle α of the prism 16 can be reduced from 14.6° to 12.3°. Consequently, the bottom area can be reduced by 15 percent, whereby it is possible to improve the converging magnification in proportion to the reduction.

Figure 28:
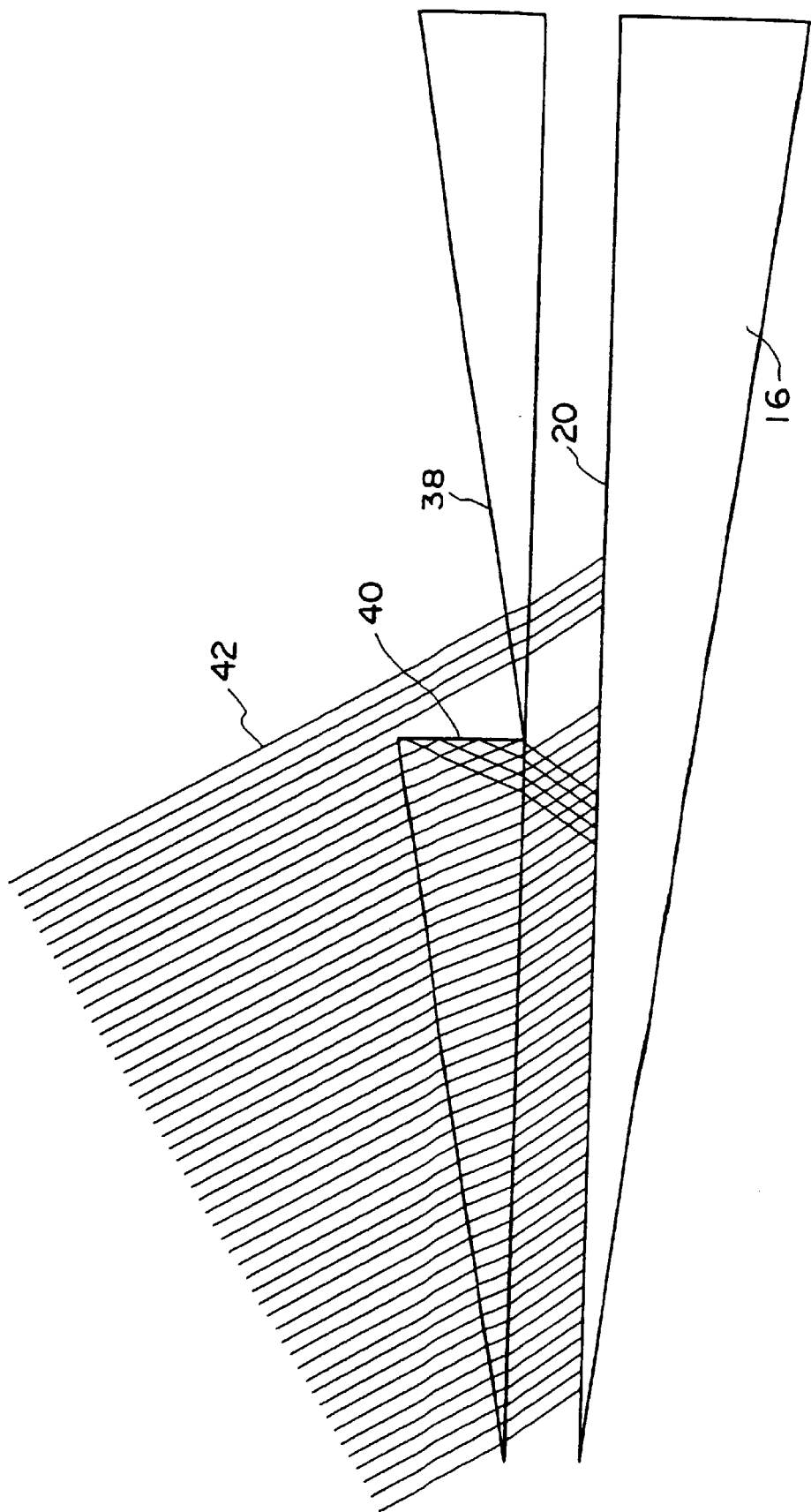
FIG. 28 is an explanatory drawing which shows an aspect in a case where sunlight enters a Fresnel lens in the embodiment shown in FIG. 27.

As shown in FIG. 28, for the purpose of reducing the thickness of the Fresnel lens 38, usually a surface 40 which is sandwiched by the incident surface and the bottom is perpendicular to the incident surface 20 of the prism 16. Due to the surface 40, a part of the sunlight incident on the Fresnel lens 38 performs total internal reflection and enters the prism 16 in a direction which makes it difficult to perform total internal reflection on the incident surface 20. In FIG. 28, four out of the 50 incident rays of light 42 reflect in inappropriate directions due to the occurrence of total internal reflection. Therefore, the amount of sunlight incident on the solar cell (not shown in the drawing) is reduced by eight percent.

Figure 29:
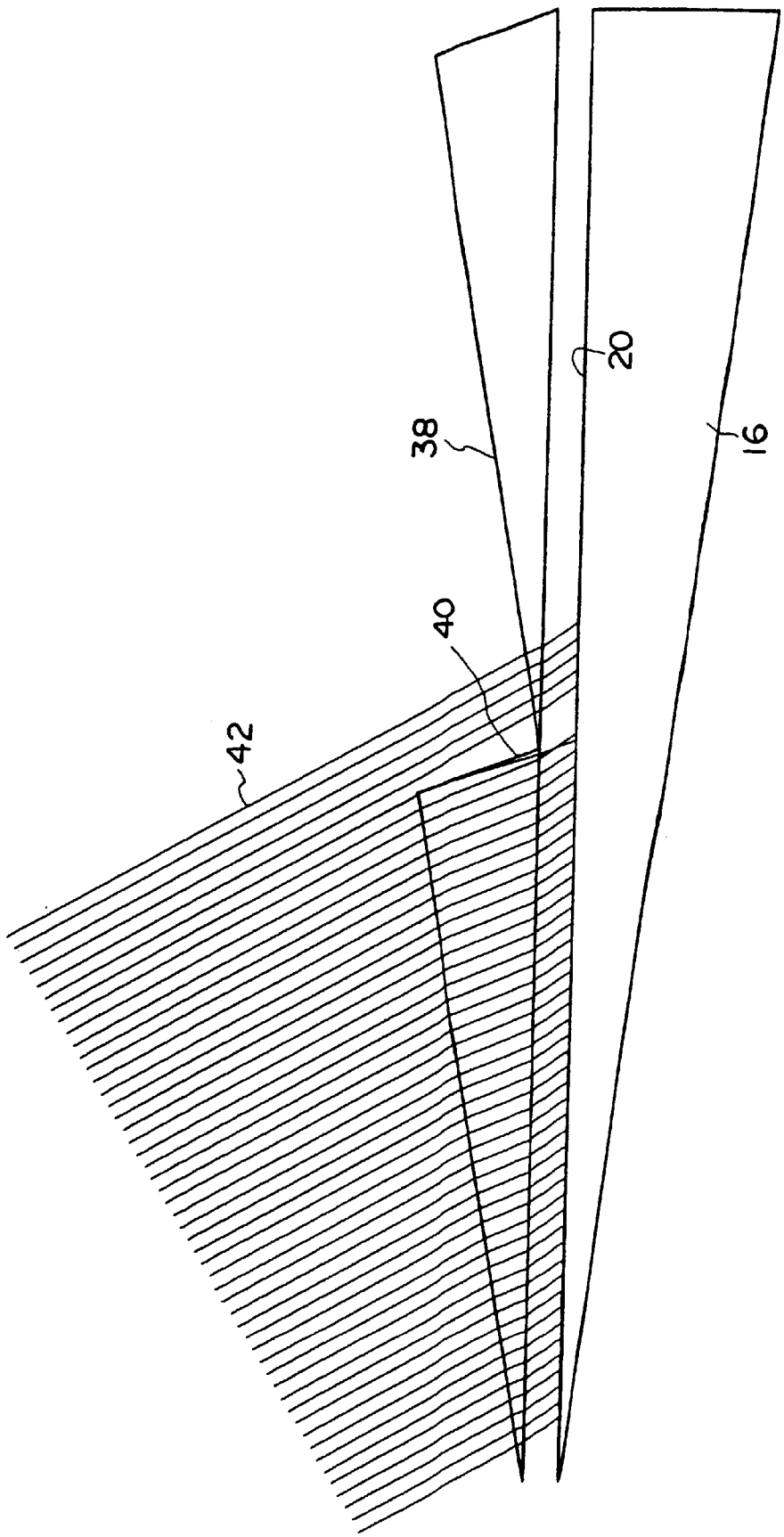
FIG. 29 is an explanatory drawing which shows an aspect in a case where sunlight enters the Fresnel lens in the embodiment shown in FIG. 27.

In order to solve the problem described above, in this embodiment, the aforementioned surface 40 is formed so that it is not perpendicular to the incident surface 20 of the prism 16, but is inclined at a prescribed angle, as shown in FIG. 29. In FIG. 29, the surface 40 is inclined so that the angle is approximately 20 degrees to the normal line which is defined against the incident surface 20. Due to such a constitution, it is possible to reduce the rate of total internal reflection in inappropriate directions on the surface 40 to be performed by the sunlight incident on the Fresnel lens. In the example shown in FIG. 29, only one out of 50 rays of light 42 performs internal total reflection. Thus, the rate of reduction of the sunlight incident on the solar cell is limited to two percent.

Sixth Embodiment

Figure 30:
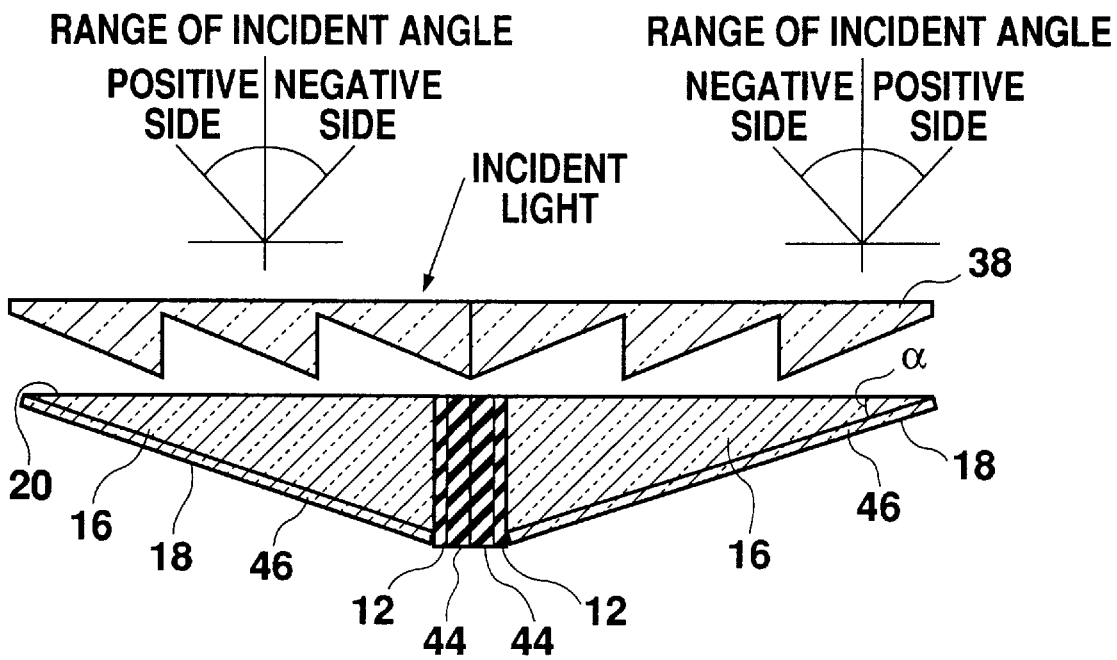
FIG. 30 is a section showing constitution of the solar module according to a sixth embodiment of the present invention.

FIG. 30 is a section showing the solar module according to a sixth embodiment of the present invention. In FIG. 30, the prism 16 is arranged so that the incident surface 20 is horizontal and the bottom on which the solar cell 12 is installed connects with the prism 16 via a board for installing solar batteries. A V groove 46 is formed on the side of the mirror surface of the prism 16 in a perpendicular direction toward a surface of the paper. The V groove 46 functions so that the incident sunlight which enters the prism 16 from the negative side shown in FIG. 30 is refracted in a three-dimensional direction and finally advances in a direction of the solar cell. Such a constitution of the V groove has been known to the public. For example, it is disclosed in National Publication of Translated Version No. Hei 6-511602. If the incident surface 20 is placed horizontally, sunlight will enter at an incident angle of ±35 degrees. In this case, if the aforementioned V groove 46 is provided, PC resin is used as a material of the prism 16, and the apex angle of the prism 16 is 21.1 degrees, the sunlight can be efficiently converged in a direction of the solar cell 12 due to total internal reflection.

In this embodiment, a Fresnel lens 38 is provided as a polarizer on the side of the incident surface 20 of the prism 16. Due to this Fresnel lens 38, for example, the sunlight incident on the lens at an incident angle of −35 degrees, which is the most severe angle, can enter the prism 16 at a slightly moderated angle of −30 degrees. Therefore, the apex angle α of the prism 16 can be reduced to 19.5 degrees, and the converging magnification can be improved by approximately 10 percent, that is, from 2.59 to 2.82. In the example of FIG. 30, a single side converging type is used as a solar cell 12, and two pieces of solar cells are used. However, if a double side converging type is substituted for them, one solar cell 12 will be enough and the aforementioned converging magnification will be 5.6.

Figure 31:
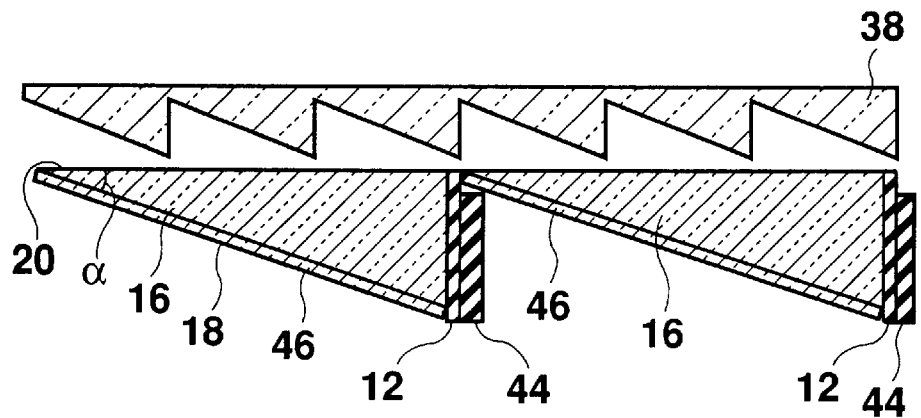
FIG. 31 is a section showing a modification of the solar module according to the sixth embodiment of the present invention.

FIG. 31 shows a modification of this embodiment. In FIG. 31, the arrangement is such that the bottoms of two prisms 16 do not face each other and these bottoms and apex angles are in the same direction. Therefore, the configuration of crest of the Fresnel lens 38 differs from that shown in FIG. 30.

Figure 32:
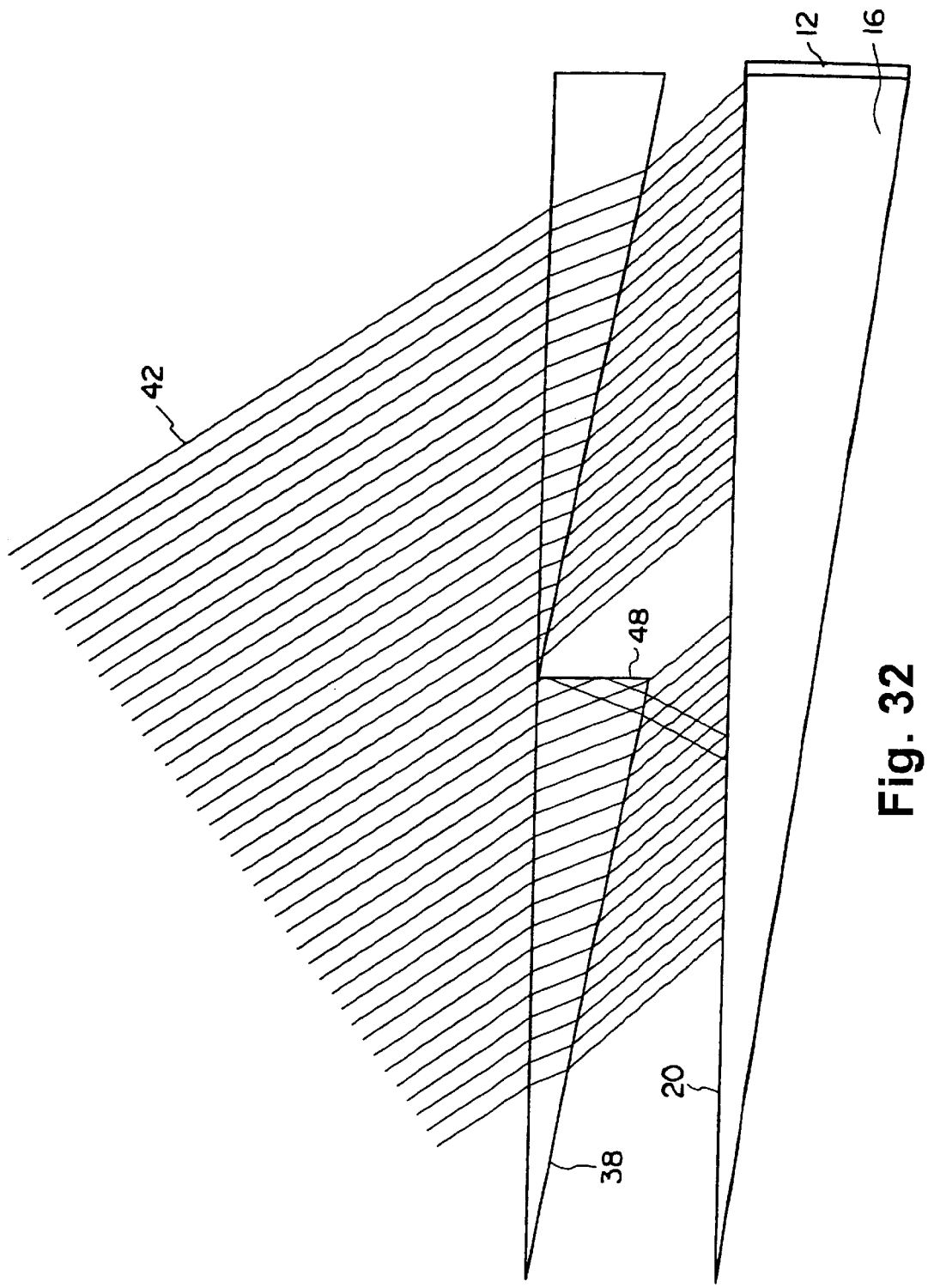
FIG. 32 is an explanatory drawing which shows an aspect in a case where sunlight enters the Fresnel lens according to the embodiment shown in FIG. 30.

FIG. 32 shows an aspect of the rays of light 42 incident on the aforementioned Fresnel lens 38 at an angle of +35 degrees. On the Fresnel lens 38 which is used in this embodiment, a perpendicular 48 is formed in such a manner that it is sandwiched between an incident surface and a bottom and is perpendicular to the incident surface 20 of the prism 16. Therefore, some of the rays of light 42 incident on the Fresnel lens 38 perform total internal reflection on the perpendicular 48, and then comes in the prism 16 at an angle different from that of the other sunlight. However, as described above, the V groove 46 is formed on the prism 16 of this embodiment. Therefore, if the angle of the sunlight which performs total internal reflection on the perpendicular 48 is similar to that shown in FIG. 32, it will be possible to withdraw the sunlight in a direction of the solar cell 12.

Figure 33:
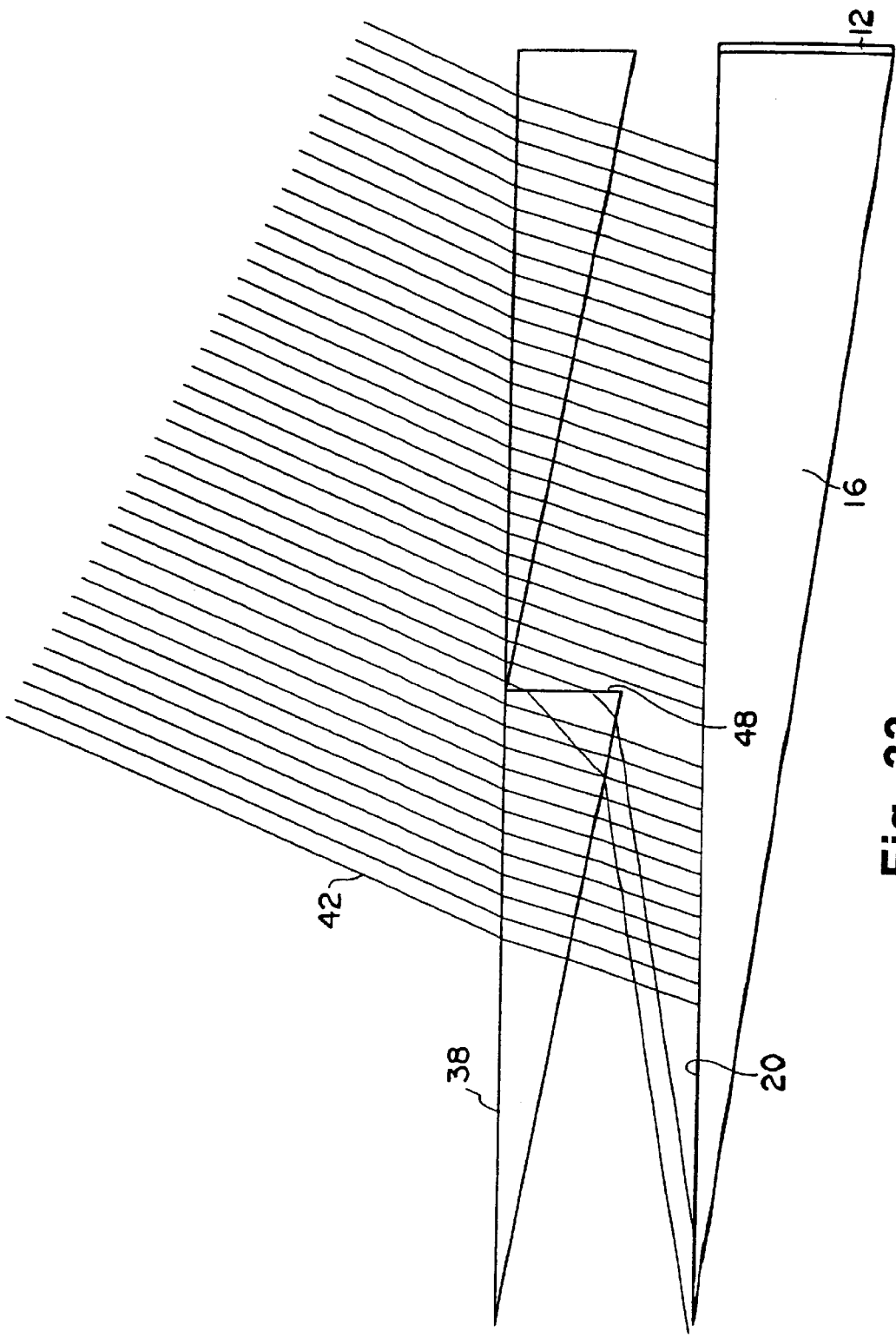
FIG. 33 is an explanatory drawing which shows an aspect in a case where sunlight enters the Fresnel lens according to the embodiment shown in FIG. 30.
Figure 34:
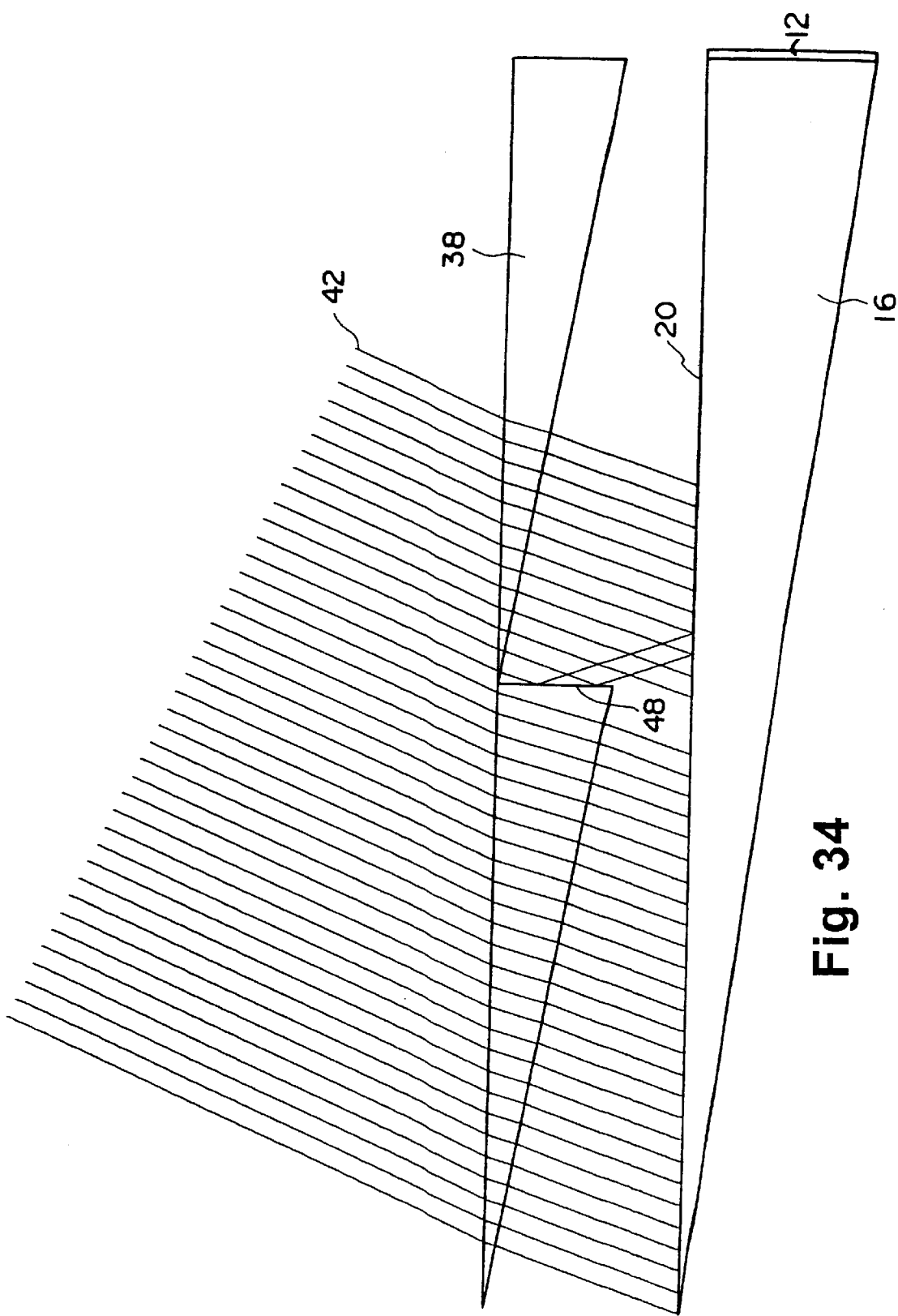
FIG. 34 is an explanatory drawing which shows an aspect in a case where sunlight enters the Fresnel lens according to the embodiment shown in FIG. 30.

On the other hand, FIG. 33 shows an aspect of the case where the sunlight enters the Fresnel lens 38 at an angle of −35 degrees. In FIG. 33, the rays of light 42 are refracted on the perpendicular 48 once and then refracted again at the time of exiting through the Fresnel lens 38. Therefore, the sunlight enters the incident surface 22 of the prism 16 at an extraordinary large angle. In such a case, even though the V groove 46 described above is formed, it is impossible to change the direction of the sunlight on the side of the solar cell 12. Consequently, in this embodiment, a reflection film is provided on the perpendicular 48 so as to have a reflection surface which is capable of reflecting sunlight. Due to this reflection surface, the sunlight incident on the perpendicular 48 is reflected thereon and enters the incident surface 20 of the prism 16 at a positive angle, as shown in FIG. 34. Thus, it facilitates the incidence of the sunlight on the solar cell 12. Also, in such a case that the sunlight enters the Fresnel lens 38 at a positive angle, as shown in FIG. 32, it is supposed to have reflection on the perpendicular 48. Therefore, it offers no problem that the perpendicular is a reflection surface as described above.

Due to the constitution described above, in this embodiment, the apex angle α of the prism 16 can be reduced and the converging magnification can be improved in proportion to it.

Seventh Embodiment

Figure 35:
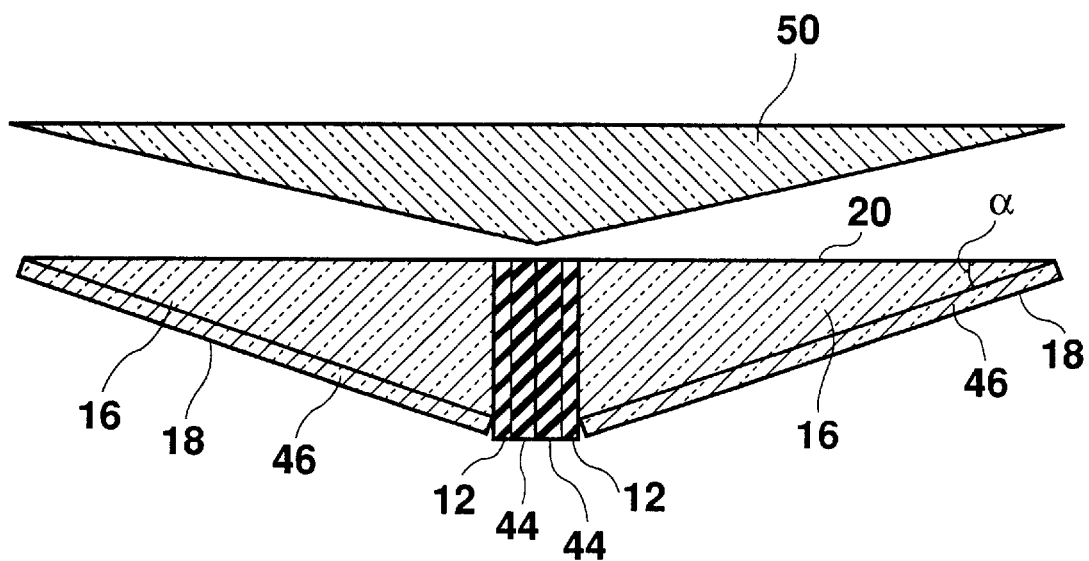
FIG. 35 is a section showing constitution of the solar module according to a seventh embodiment of the present invention.

FIG. 35 is a section showing the solar module according to a seventh embodiment of the present invention. In FIG. 35, a triangular prism 50 is provided as a substitute for the Fresnel lens 38 shown in FIG. 30, which is used in the sixth embodiment. The triangular prism 50 also makes it possible for the sunlight with an incident angle of −35 degrees to enter the incident surface 20 of the prism 16 at a slightly moderated angle of −30 degrees. Therefore, also in this embodiment, it is possible to decrease the apex angle α of the prism 16 up to 19.5 degrees. Further, similarly to the sixth embodiment, if two pieces of solar cells 12 are used, the converging magnification will be improved by approximately 10 percent.

Figure 36:
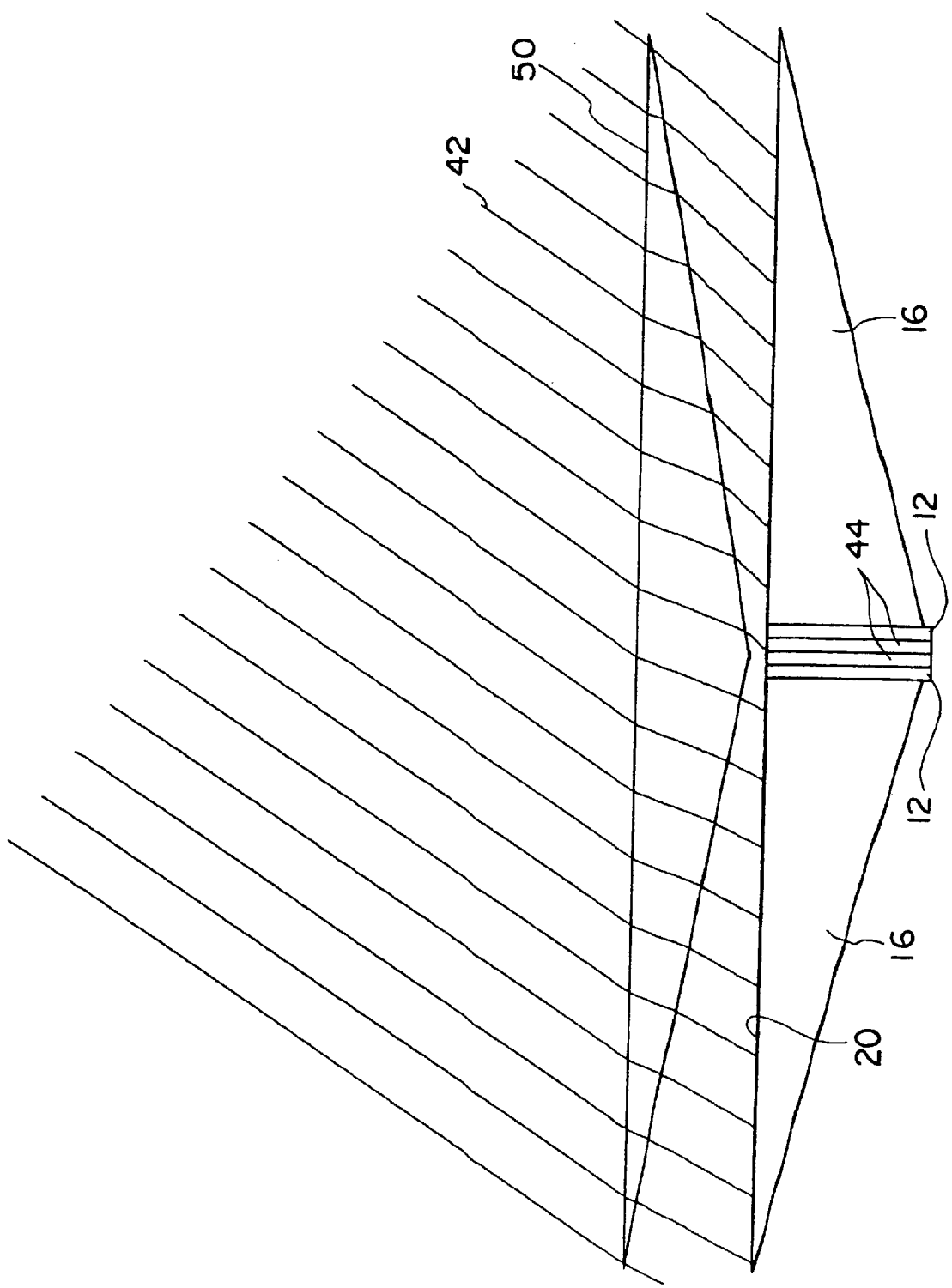
FIG. 36 is an explanatory drawing which shows an aspect in a case where sunlight enters the triangular prism according to the embodiment shown in FIG. 35.

FIG. 36 shows an aspect of the incidence of the rays of light 42 on the triangular prism 50 shown in FIG. 35. In FIG.

36, the apex of the triangular prism 50 faces the side of the incident surface 20 of the prism 16. In the example shown in FIG. 36, there is no problem on the right side of the drawing because the rays of light enter the prism 16 at a positive angle. With regard to the prism 16 on the left side of the drawing, the rays of light 42 incident on the triangular prism 50 at an angle of −35 degrees enter at a moderated angle of −30 degrees. If the incident angle is −30 degrees or so, it will be possible to change the course of the rays of light to the solar cell 12 due to the operation of V groove 46 described in the sixth embodiment. Therefore, in any case, convergence of the incident rays on the solar cell can be performed.

Figure 37:
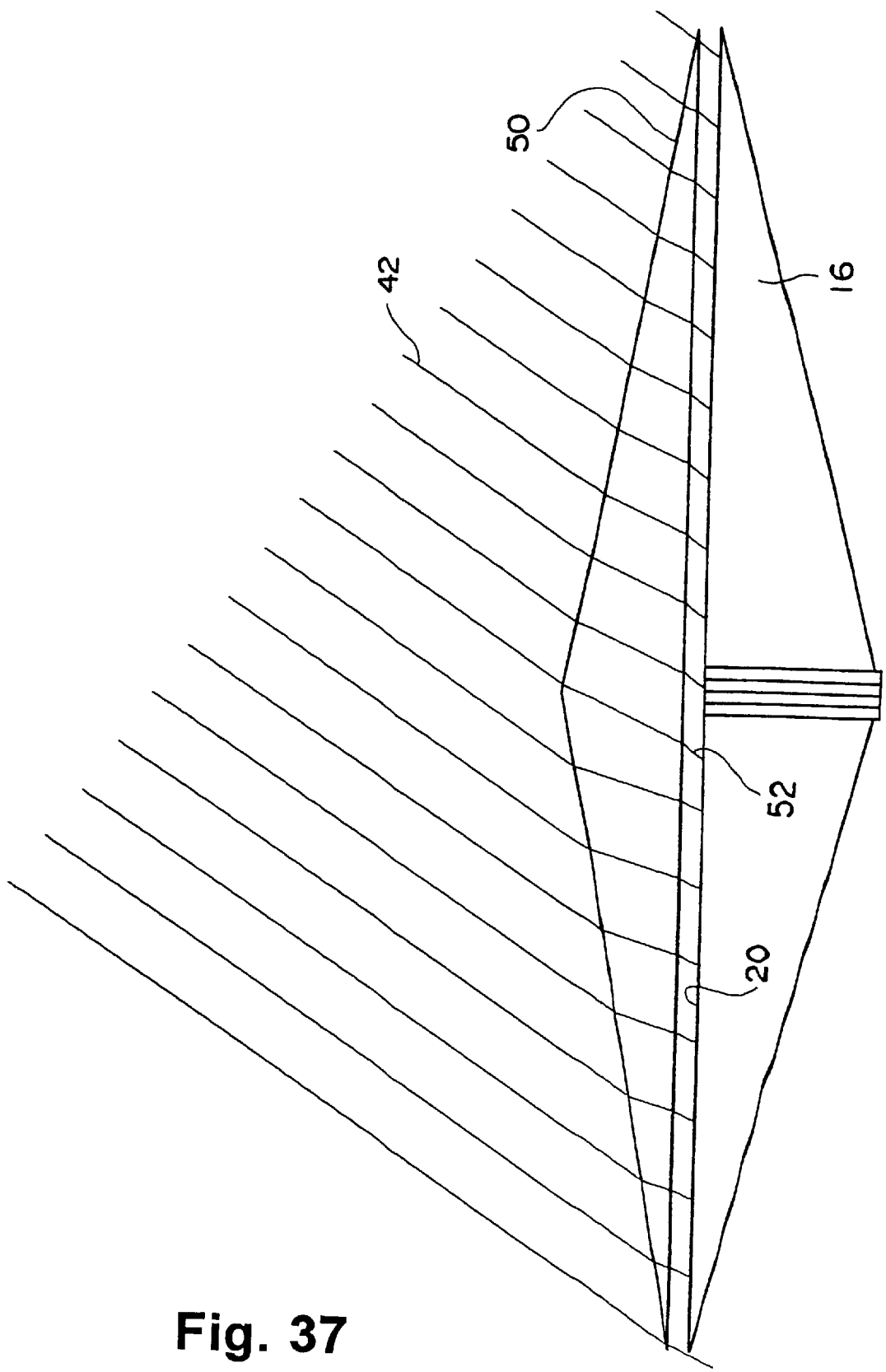
FIG. 37 is an explanatory drawing which shows an aspect in a case where sunlight enters a modification of the triangular prism according to the embodiment shown in FIG. 35.

FIG. 37 shows a modification of the triangular prism 50. In FIG. 37, the apex of the triangular prism 50 faces the opposite side of the incident surface 20 of the prism 16. Also in this embodiment, similarly to FIG. 36, since the angle of the rays incident on the prism 16 is moderated, the converging magnification can be improved. However, in the example shown in FIG. 37, when the rays incident on the circumference of the apex of triangular prism 50 enter the prism 16, the incident angle of the rays 52 becomes large, whereby the rays cannot be converged. Therefore, the converging magnification becomes slightly smaller than that of the example shown in FIG. 36.

Eighth Embodiment

Figure 38:
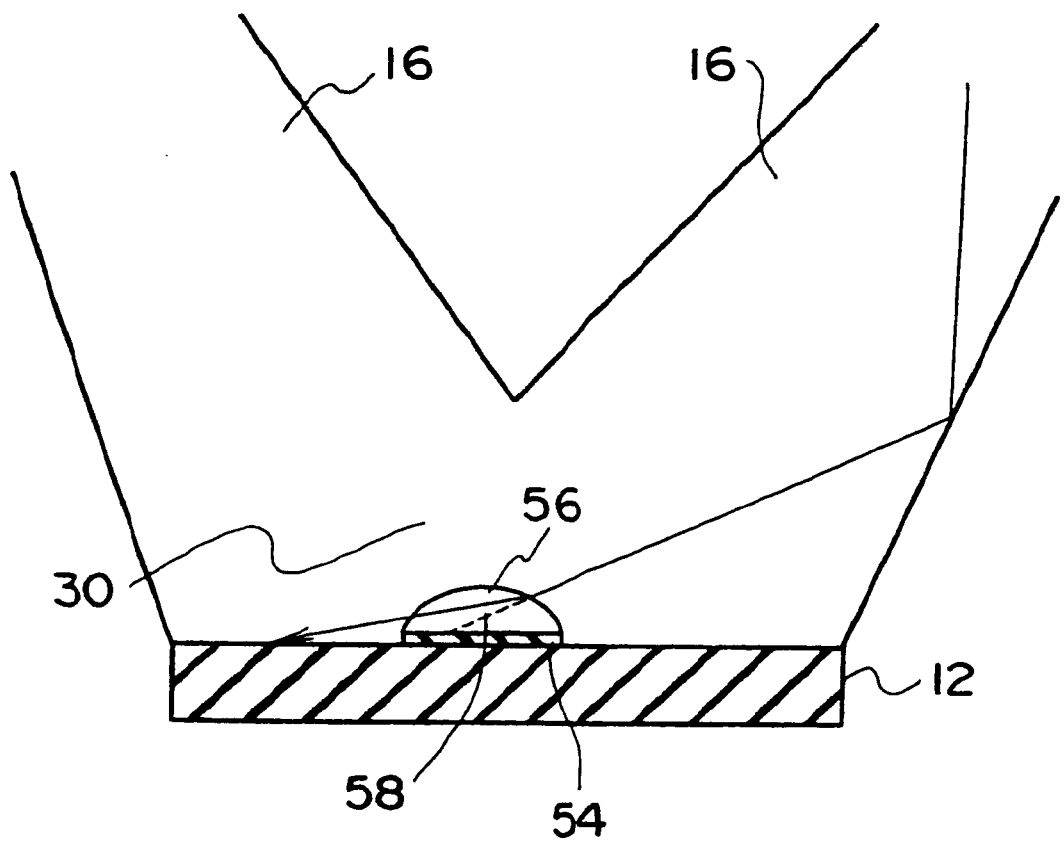
FIG. 38 is a section showing constitution of the solar module according to an eighth embodiment of the present invention.

FIG. 38 is a section showing the solar module according to an eighth embodiment of the present invention. In FIG. 38, the solar cell 12 is provided on the bottom of the extension 30 which is further extended from the apex of the V shape formed by a pair of prisms 16. An electrode 54 for fetching generated output is provided on the solar cell 12, more specifically, on the side of a joint to the extension 30. Therefore, even though sunlight enters the electrode, it cannot contribute to power generation. In this embodiment, as shown in FIG. 38, a convex cavity 56 is provided on the side of the extension 30 of a portion on which the electrode 54 is formed. If air is filled in the cavity 56, incident sunlight will be refracted at an interface between the extension 30 and the cavity. Thus, a ray of light 58 which is supposed to enter the electrode 54 is refracted and enters the reception surface of the solar cell 12 where the electrode is not provided. Therefore, an amount of sunlight which effectively enters the solar cell 12 is increased, thereby increasing the quantity of power generation.

For example, if the cavity 56 is semiellipsoidal in form as shown in FIG. 38, the quantity of power generation can be increased by approximately five percent on the principle mentioned above because a rate of the area occupied by the electrode 54 is eight percent.

As described above, according to the present invention, since the prisms which compose the solar concentrator gradually become thick toward the apex of the V shape, the solar concentrator has such a constitution that it widens toward the end, and incident sunlight performs repetitive reflection and total internal reflection on the incident surface and the mirror surface of the prism and then emerges from the bottom. Therefore, it is possible to converge 80 to 90 percent of sunlight having an incident angle of 20 to 24 degrees to the normal line defined against the incident surface of the solar cell installed at the bottom. Therefore, the movement of the sun which varies depending on seasons can be followed up without actually tracking the sun.

Further, since the solar concentrator according to the present invention extends in a longitudinal direction, it is possible to thoroughly follow up the movement of the sun during the course of a day. Therefore, without tracking the sun and with the solar concentrator fixed, sunlight can be converged with a large converging magnification.

Further, by forming a V groove at the apex of a V shape formed by a pair of prisms, even though an incident angle of sunlight becomes large, the reduction of an outgoing intensity is suppressed, and further the converging magnification can be improved.

Further, since the refractive index of the extension is larger than that of the prisms, efficient refraction in a converging direction can be realized and an area of the bottom of the extension can be reduced. Therefore, the converging magnification can be improved by the reduced portion.

Further, if the incident surface of the prism is horizontal, the incident angle of sunlight on the prism can be increased due to the polarizer provided. Therefore, the apex angle of the prism can be reduced, an area of the outgoing surface can be reduced, and the converging magnification can be improved. Further, In this case, if the perpendicular of a Fresnel lens which is a polarizer is a reflection surface, sunlight incident on the prism at a large incident angle can be eliminated and the converging magnification can be improved.

What is claimed is:

1. A solar module comprising:

a solar concentrator having a pair of prisms for converging sunlight by utilizing reflection and total internal reflection, each of said prisms being a member having a refractive index larger than that of air and having a triangular section, wherein said prisms form a V shape having an apex and an extension having a bottom spaced from the apex, and a solar cell is arranged on the bottom of the extension.

2. The solar module according to claim 1, wherein a V groove is formed at the apex of said V shape and extending in the longitudinal direction thereof.

3. The solar module according to claim 1, wherein said extension has a refractive index larger than the refractive indices of said prisms.

4. The solar module according to claim 3, wherein the interface of said extension and said prisms is convex on the side of said prisms.

5. The solar module according to claim 1, wherein a mirror surface is formed on a back side of each of said prisms, the back side being opposite from the side facing the other prism, and wherein said mirror surfaces face in the direction of the side facing the other prism.

6. The solar module according to claim 1, wherein a layer of adhesive is provided between said solar cell and said extension.

7. The solar module according to claim 1, wherein a triangular cavity is provided in each of said prisms, the triangular cavity being an upside-down image of sections of said prisms.

8. The solar module according to claim 7, wherein a substance having a refractive index smaller than the refractive indices of said prisms is filled in said cavity.

9. The solar module according to claim 1, wherein a convex cavity is provided in a prism portion of the interface between said prism and said solar cell and is the prism side of a part corresponding to an electrode position of said solar cell.

10. A solar module comprising:

a solar concentrator prism comprising a transparent material with a refractive index larger than that of air, the prism having a triangular section, and performs convergence by utilizing reflection and total internal reflection, wherein said prism has a Fresnel lens for polarizing incident sunlight to a direction in which the incident angle of sunlight to said prism is increased.

11. The solar module according to claim 10, wherein the Fresnel lens has an incident surface and a bottom face, and wherein a surface sandwiched between the incident surface and the bottom face of said Fresnel lens is tilted toward an incident surface of said prism by an angle.

12. The solar module according claim 10, wherein said prism is arranged so that the incident surface of said prism is horizontal.

13. The solar module according to claim 10, wherein the Fresnel lens has an incident surface and a bottom face, and wherein a perpendicular surface sandwiched between the incident surface and the bottom face of said Fresnel lens is a reflection surface.

14. The solar module according to claim 10, wherein a solar cell is arranged on one side of the prism, and a convex cavity is provided in a prism portion of the interface between said prism and said solar cell and is the prism side of a part corresponding to an electrode position of said solar cell.

* * * * *